United States Patent
Mizukawa

(10) Patent No.: US 7,750,827 B2
(45) Date of Patent: Jul. 6, 2010

(54) CODING DEVICE, PULSE REGENERATING DEVICE, AND COMMUNICATIONS SYSTEM

(75) Inventor: Shigemitsu Mizukawa, Ritto (JP)

(73) Assignee: Ishida Co. Ltd., Kyoto (JP)

(*) Notice: Subject to any disclaimer, the term of this patent is extended or adjusted under 35 U.S.C. 154(b) by 139 days.

(21) Appl. No.: 12/281,496

(22) PCT Filed: Sep. 26, 2007

(86) PCT No.: PCT/JP2007/068663

§ 371 (c)(1),
(2), (4) Date: Sep. 3, 2008

(87) PCT Pub. No.: WO2008/050569

PCT Pub. Date: May 2, 2008

(65) Prior Publication Data

US 2009/0041098 A1 Feb. 12, 2009

(30) Foreign Application Priority Data

Oct. 18, 2006 (JP) .............................. 2006-283755
Dec. 13, 2006 (JP) .............................. 2006-335998

(51) Int. Cl.
*H03M 5/00* (2006.01)
(52) U.S. Cl. .......................................... 341/58; 341/59
(58) Field of Classification Search ............. 341/58–59
See application file for complete search history.

(56) References Cited

U.S. PATENT DOCUMENTS 6,084,536 A * 7/2000 Arts ............................. 341/58
6,891,483 B2 * 5/2005 Noda et al. .................... 341/58
7,142,135 B1 * 11/2006 Chen et al. .................... 341/59

FOREIGN PATENT DOCUMENTS

| JP | 55-132160 | 10/1980 |
| JP | 56-149152 | 11/1981 |
| JP | 58-121855 | 7/1983 |
| JP | 63-120527 | 5/1988 |
| JP | 1-292927 | 11/1989 |
| JP | 8-18611 | 1/1996 |
| JP | 2000-134186 | 5/2000 |
| JP | 2000-267771 | 9/2000 |
| JP | 2002-94488 | 3/2002 |

OTHER PUBLICATIONS

International Search Report, mailed Jan. 15, 2008 and issued in corresponding International Patent Application No. PCT/JP2007/068663.

* cited by examiner

*Primary Examiner*—Khai M Nguyen
(74) *Attorney, Agent, or Firm*—Staas & Halsey LLP

(57) ABSTRACT

It is an object of the present invention to provide coding techniques which allow for higher efficiency and easier synchronization with coded data. In order to attain the object, a coding device according to the present invention converts 2-bit informational data into 4-bit coded data according to a predetermined coding rule. According to the coding rule employed in the coding device, one of four possible kinds of bit strings of informational data is converted into alternately a bit string of four bits in which each of values of two successive bits is "1" and a bit string of four bits in which each of values of all bits is "0". Then, the other kinds of bit strings are converted into bit strings of four bits which differ from one another, in each of which a value of only one bit is "1".

3 Claims, 35 Drawing Sheets

F I G . 1
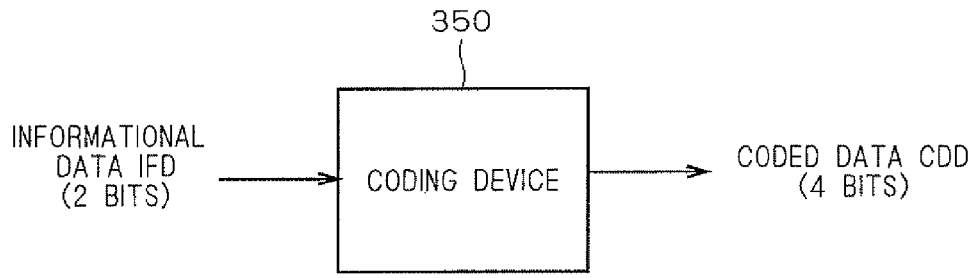
F I G . 2
| INFORMATIONAL DATA | | CODED DATA |
|---|---|---|
| 0 0 | → | 1 0 0 0 |
| 0 1 | → | 0 1 0 0 |
| 1 0 → | | 0 0 1 0 |
| 1 1 | ALTERNATELY | 1 1 0 0<br><br>0 0 0 0 |
F I G . 3
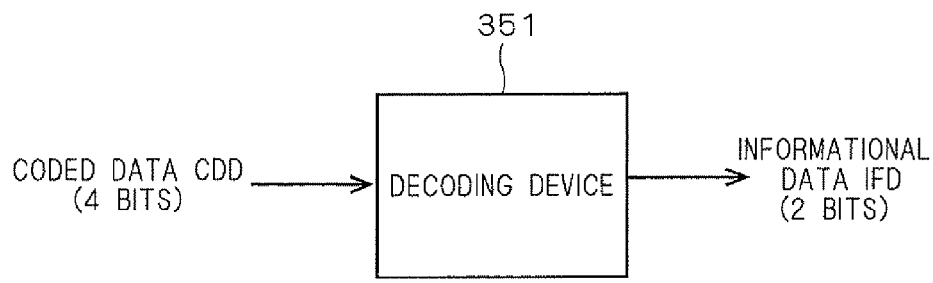

FIG. 4

| CODED DATA | | INFORMATIONAL DATA |
|---|---|---|
| 1 0 0 0 | → | 0 0 |
| 0 1 0 0 | → | 0 1 |
| 0 0 1 0 | → | 1 0 |
| 1 1 0 0<br><br>0 0 0 0 | → | 1 1 |

| INFORMATIONAL DATA | | CODED DATA |
|---|---|---|
| 0 0 | → | 1 0 0 0 |
| 0 1 | → | 0 1 0 0 |
| 1 0 | → | 0 0 1 0 |
| 1 1 | ALTERNATELY | 1 1 1 1<br><br>0 0 0 0 |

| INFORMATIONAL DATA | | CODED DATA |
|---|---|---|
| 0 0 | → | 1 0 0 0 |
| 0 1 | → | 0 1 0 0 |
| 1 1 | → | 0 0 1 0 |
| 1 0 | ⟨ ALTERNATELY | 1 1 0 0 / 0 0 0 0 |

| INFORMATIONAL DATA | | CODED DATA |
|---|---|---|
| 0 0 | → | 1 1 0 0 |
| 0 1 | → | 0 1 1 0 |
| 1 0 | → | 0 0 1 1 |
| 1 1 | ⟨ ALTERNATELY | 1 1 1 0 / 0 0 0 0 |

| INFORMATIONAL DATA | | CODED DATA |
|---|---|---|
| 0 0 | → | 1 0 0 |
| 0 1 | → | 0 1 0 |
| 1 0 | → | 0 0 1 |
| 1 1 | ALTERNATELY | 1 1 1<br><br>0 0 0 |

| INFORMATIONAL DATA | | CODED DATA |
|---|---|---|
| 0 0 | → | 0 1 1 1 |
| 0 1 | → | 1 0 1 1 |
| 1 0 | → | 1 1 0 1 |
| 1 1 | ALTERNATELY | 0 0 1 1<br><br>1 1 1 1 |

| INFORMATIONAL DATA | | CODED DATA |
|---|---|---|
| 000 | → | 10000000 |
| 001 | → | 01000000 |
| 010 | → | 00100000 |
| 011 | → | 00010000 |
| 100 | → | 00001000 |
| 101 | → | 00000100 |
| 110 | → | 00000010 |
| 111 | ALTERNATELY | 11110000 / 00000000 |

F I G . 1 5
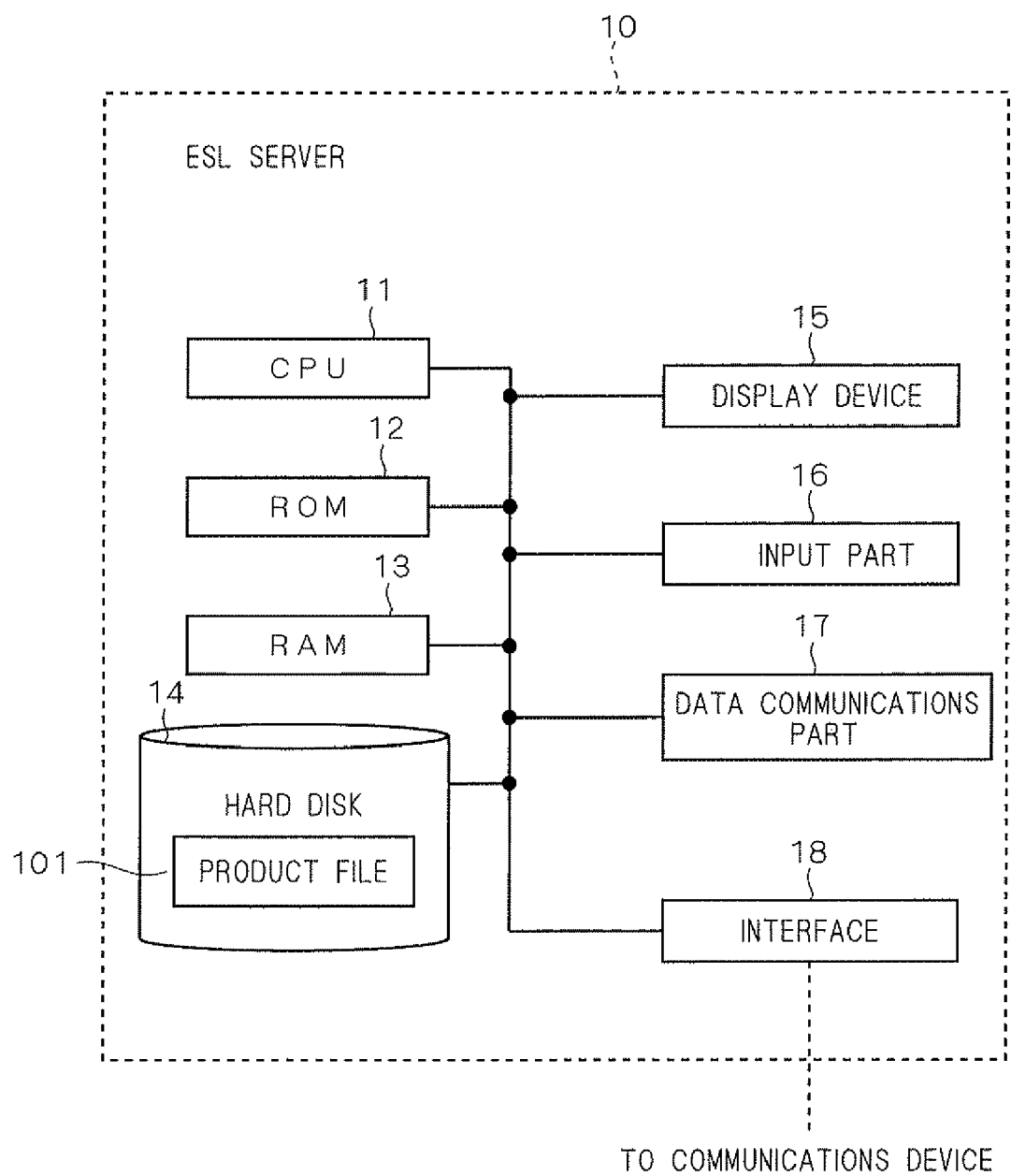

FIG. 16

| PRODUCT CODE | PRODUCT NAME | REGULAR PRICE | BARGAIN PRICE | BARGAIN PERIOD | ... | DEVICE CODE |
|---|---|---|---|---|---|---|
| ... | ... | ... | ... | ... | ... | ... |
| 49123401 | ○○BEEF FILLET STEAK | 1660 | 1280 | FROM SOME DATE AND TIME TO ANOTHER DATE AND TIME | ... | 34500 |
| 49123432 | OX-TONGUE FOR GRILL | 980 | 498 | FROM SOME DATE AND TIME TO ANOTHER DATE AND TIME | ... | 34501 |
| ... | ... | ... | ... | ... | ... | ... |

101

102

F I G . 1 7
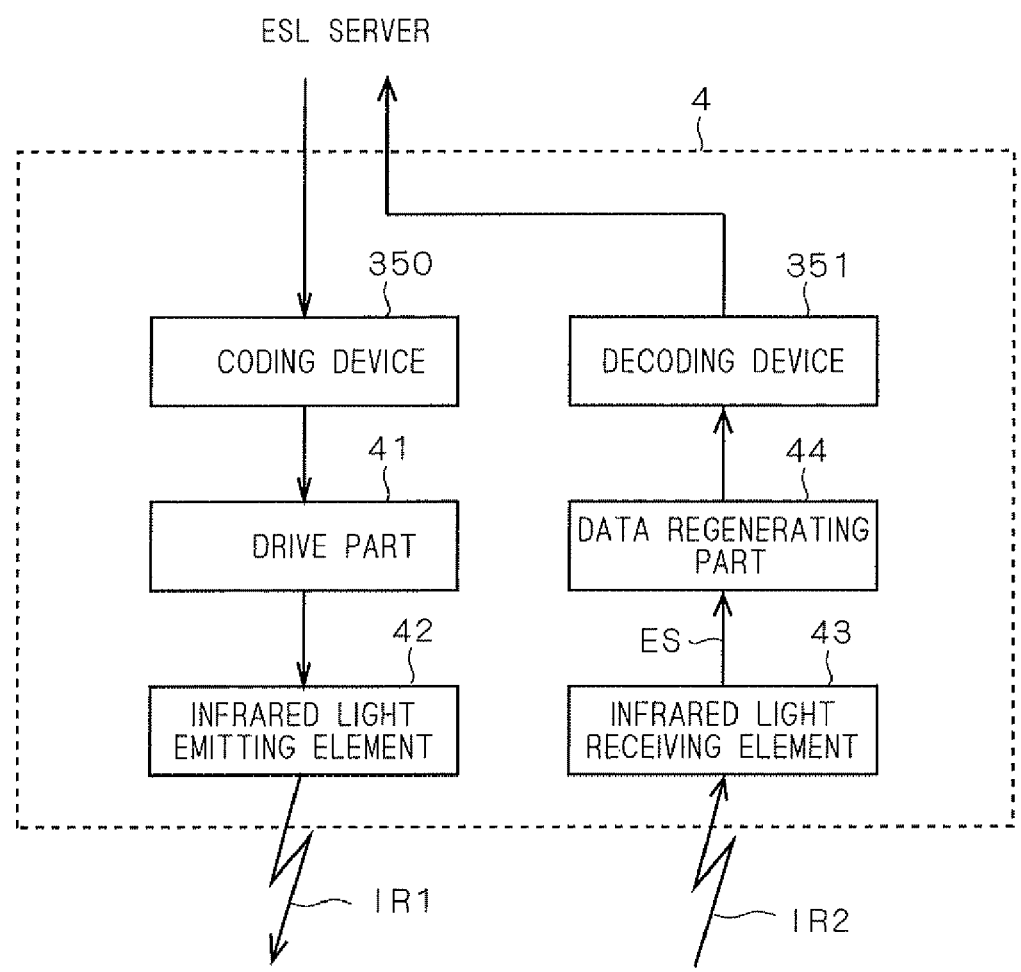

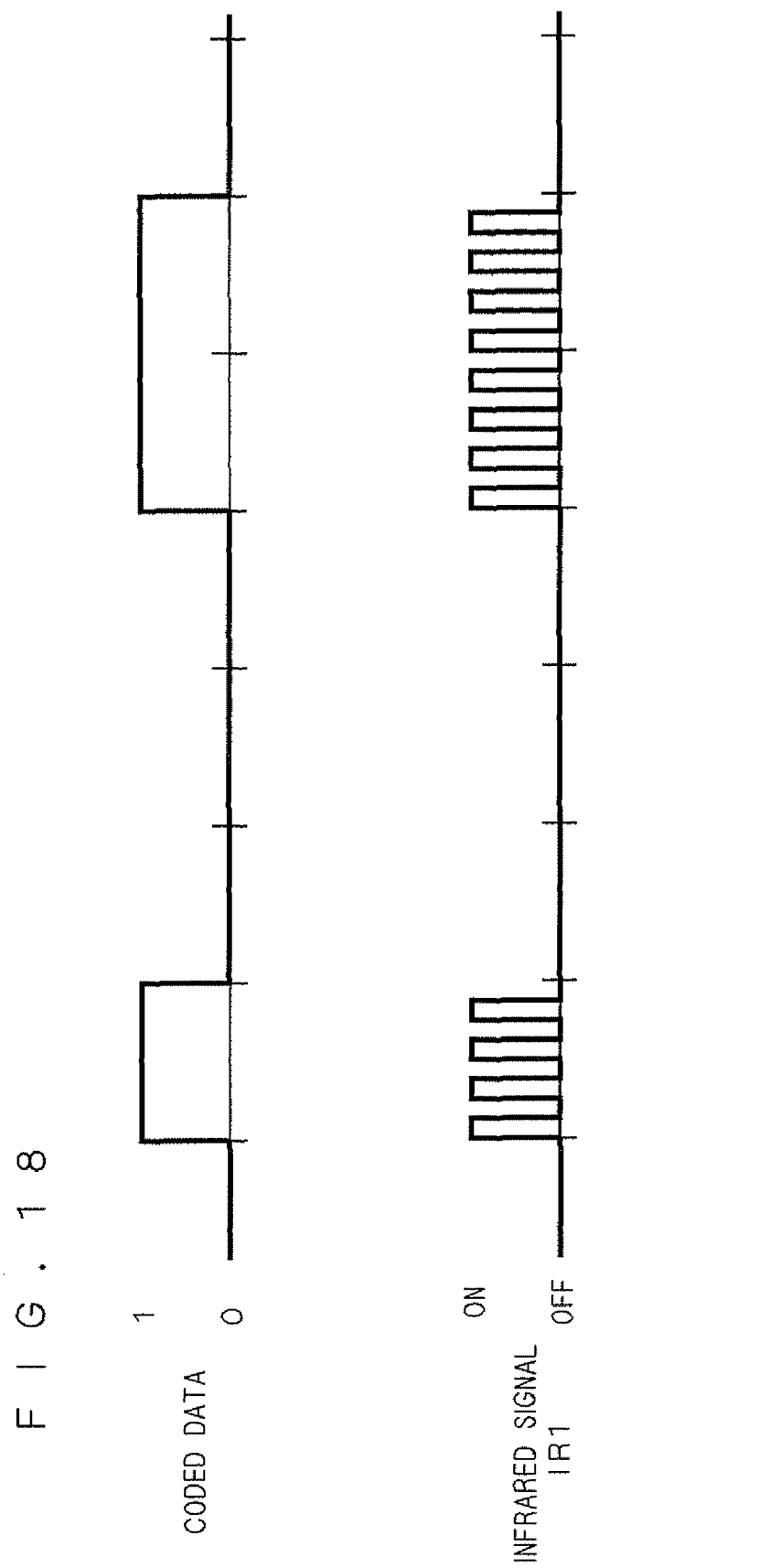

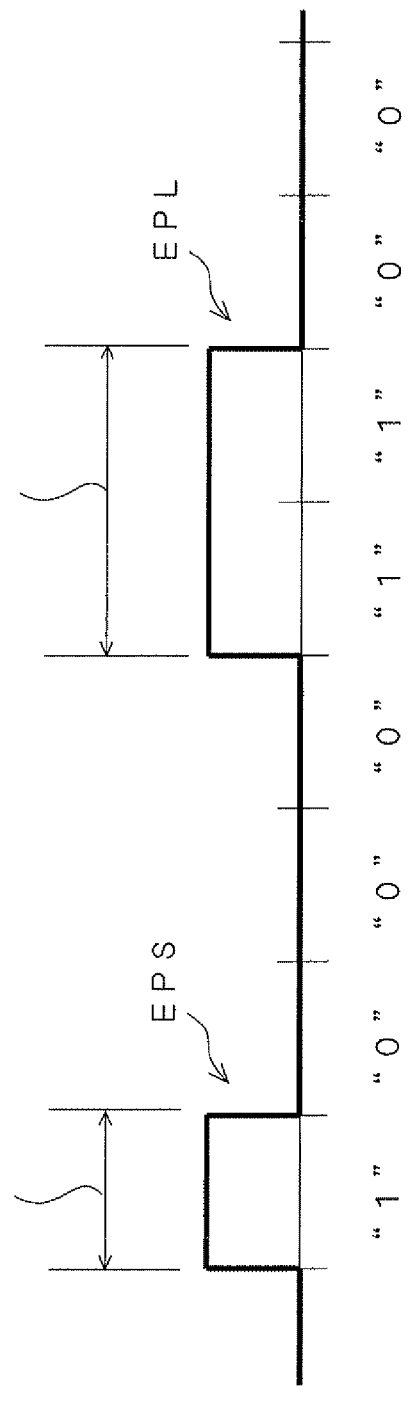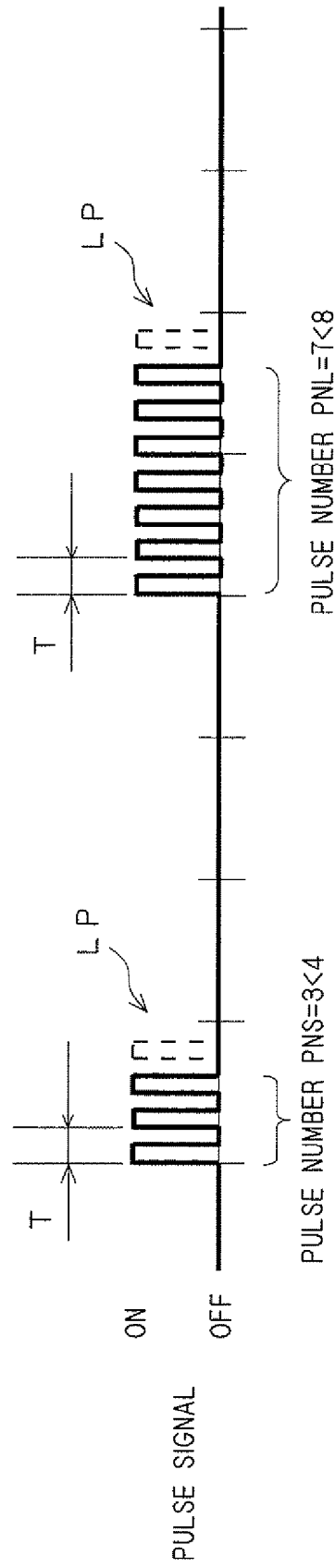
FIG. 22

F I G. 2 3
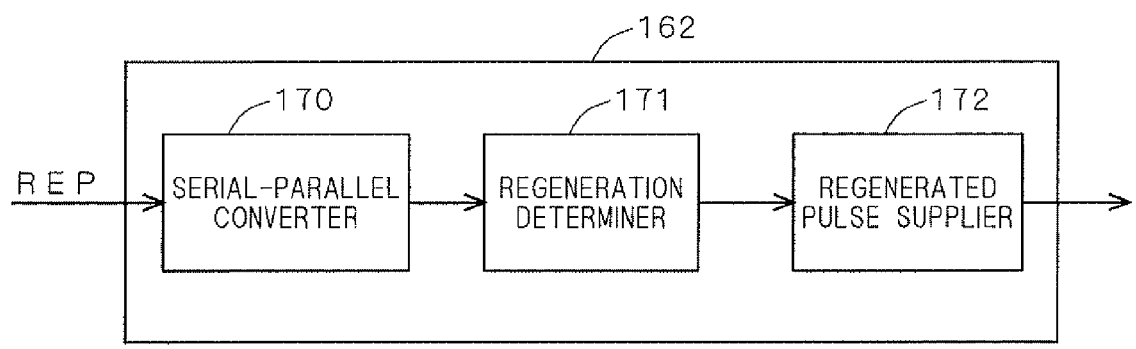

F I G . 2 5
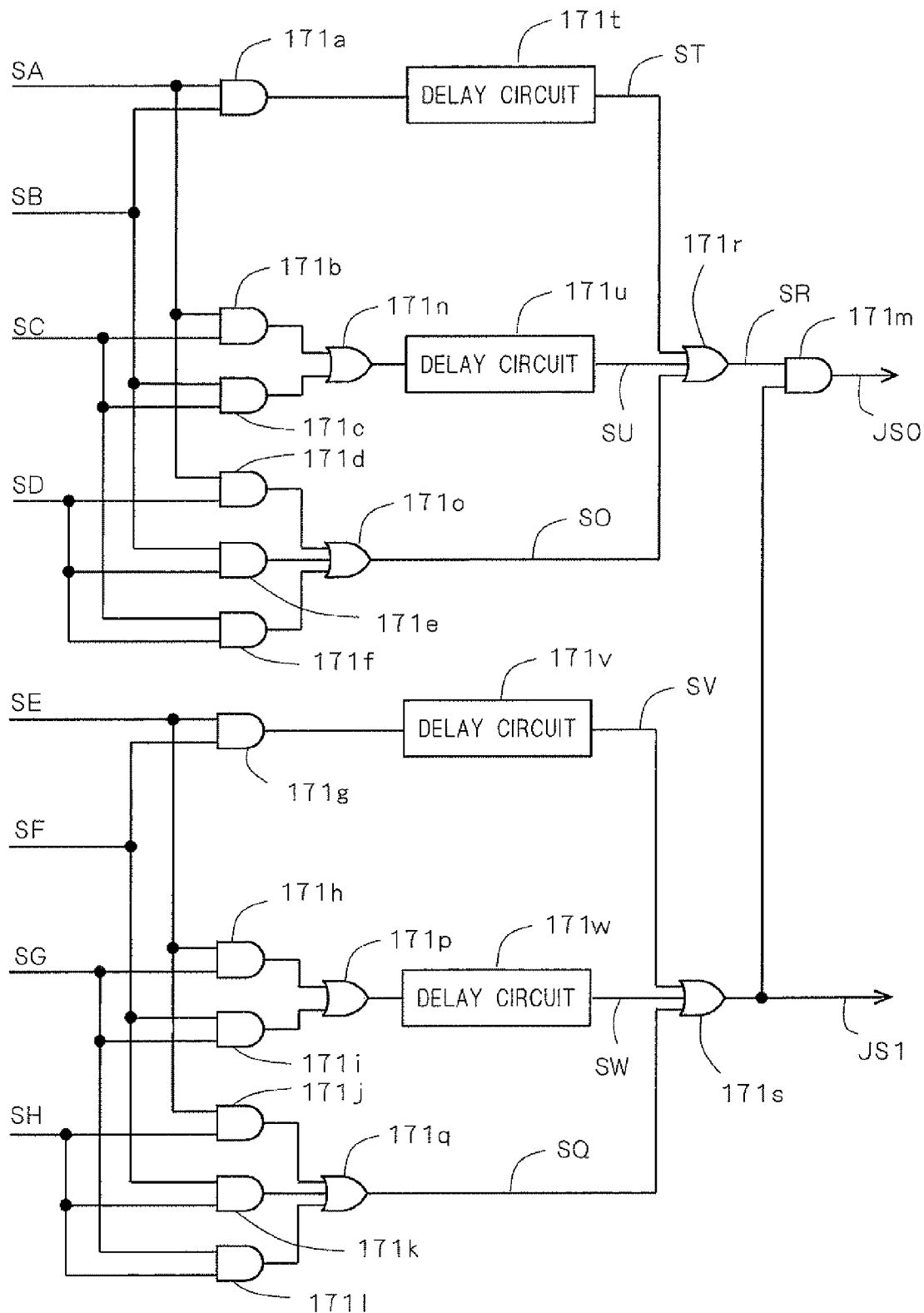

F I G . 2 6
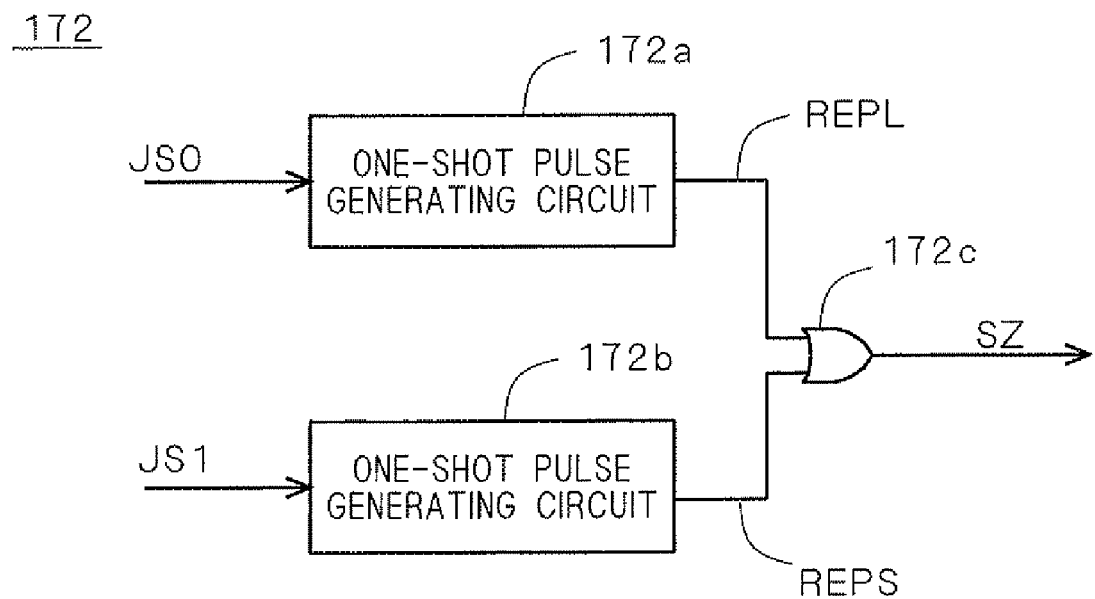

F I G . 4 1
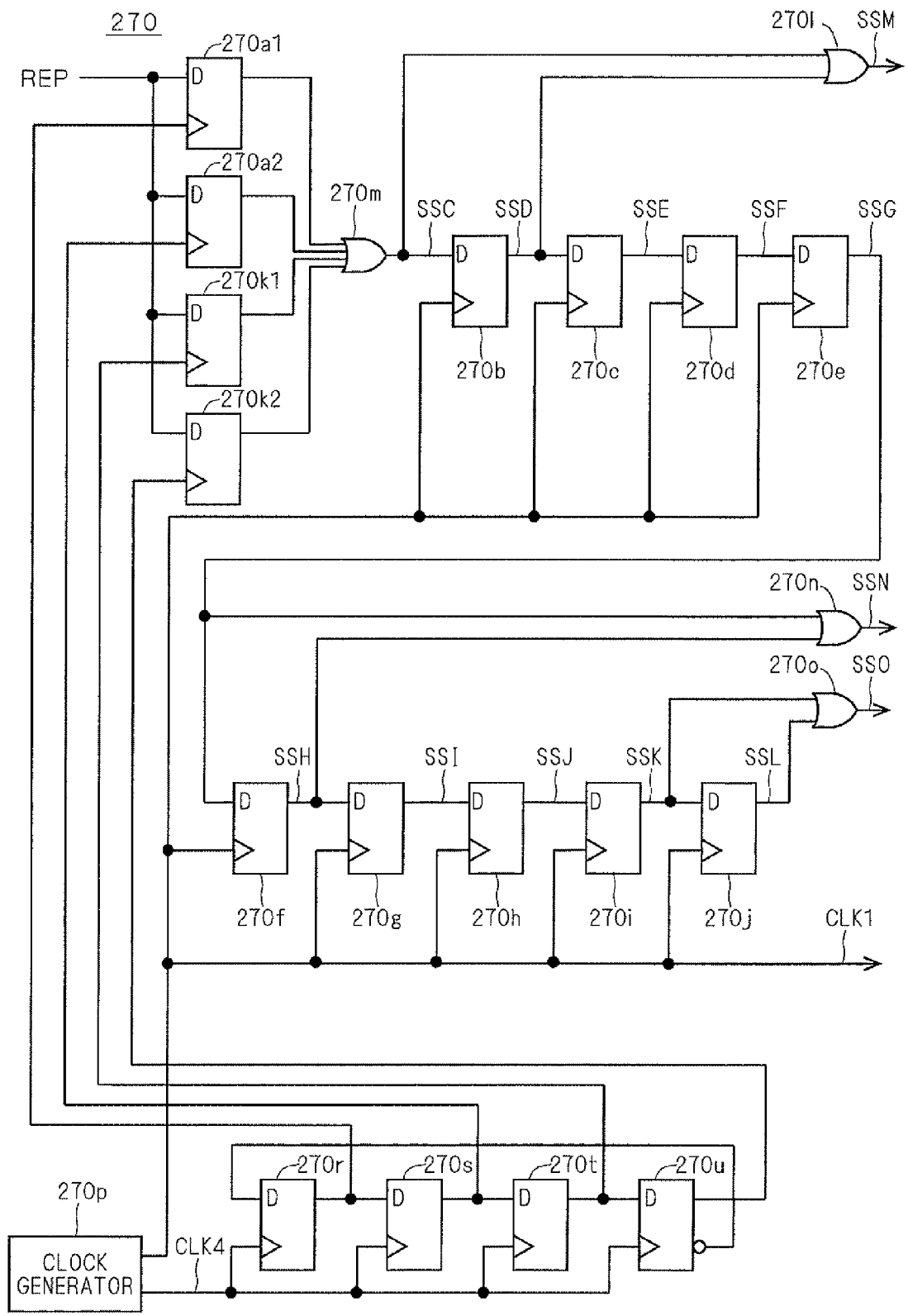

CODING DEVICE, PULSE REGENERATING DEVICE, AND COMMUNICATIONS SYSTEM

CROSS REFERENCE TO RELATED APPLICATIONS

This application claims the benefit under 35 U.S.C. Section 371, of PCT International Application Number PCT/JP2007/068663, filed Sep. 26, 2007 and Japanese Application Nos. 2006-283755 filed Oct. 18, 2006 and 2006-335998 filed Dec. 13, 2006 in Japan, the contents of which are incorporated herein by reference.

TECHNICAL FIELD

The present invention relates to techniques for coding informational data of plural bits according to a predetermined coding rule, and to techniques for regenerating a pulse signal generated at a transmitting end, at a receiving end.

BACKGROUND ART

Conventionally, various techniques regarding a method of coding data which is to be transmitted through a communication channel have been suggested. For example, Patent documents 1 and 2 disclose a coding method which is called a pulse position modulation (PPM) method. According to a PPM method, respective pieces of 2-bit data representing "00", "01", "10", and "11" are converted into respective pieces of 4-bit data representing "1000", "0100", "0010", and "0001", for example.

On the other hand, Patent documents 3 and 4 disclose a coding method which is called a coded mark inversion (CMI) method. According to a CMI method, 1-bit data representing "1" is converted into alternately 2-bit data representing "11" and 2-bit data representing "00", and 1-bit data representing "0" is converted into 2-bit data representing "01".

Patent document 3 also discloses a technique for transmitting a frame sync signal by utilizing coding rule violation (CRV).

In the meantime, in a communications system, there is a need for a technique for regenerating a pulse signal which has been generated at a transmitting end, at a receiving end, in some cases. In an infrared communications system as described in Patent document 2, for example, binary data is transmitted from a transmitting end by causing infrared light to flash, and then, at a receiving end, the infrared light transmitted from the transmitting end is received and binary data is generated from a signal of the received infrared light. Since binary data can be regarded as a pulse signal, it is possible to obtain binary data transmitted from the transmitting end by regenerating the pulse signal which has been generated at the transmitting end, based on the signal of the received light at the receiving end.

Patent Document 1: Japanese Patent Application Laid-Open No. 2000-134186
Patent Document 2: Japanese Patent Application Laid-Open No. 2000-267771
Patent Document 3: Japanese Patent Application Laid-Open No. 8-18611
Patent Document 4: Japanese Patent Application Laid-Open No. 2002-94488

DESCRIPTION OF THE INVENTION

In a case where a PPM method as described above is employed, efficiency in coding is high because data of plural bits is coded at a time. However, four kinds of bit strings represented by coded data have the same number of bits representing "1" and the same number of bits representing "0". As such, it is impossible to detect a reference phase which is required for synchronization with the coded data, from those four kinds of bit strings, to present a problem of a difficulty in achieving synchronization with the coded data.

On the other hand, in a case where a CMI method is employed, bit strings represented by coded data include bit strings "11" and "00" each of which is different in the number of bits representing "1" or "0" from a bit string "01". Accordingly, it is possible to detect a reference phase by utilizing those bit strings. Thus, a CMI method has an advantage that synchronization with the coded data can be easily achieved in decoding the coded data. Nonetheless, there is a problem of low efficiency in coding because 1-bit data is coded.

Also, in a communications system, it is required that regeneration of a pulse signal which has been generated at a transmitting end, at a receiving end, be timed as regularly as possible, in some cases. For example, in a case where binary data is obtained by regenerating a pulse signal as described above, if regeneration of the pulse signal is mistimed, omission, double reading, or the like of received data is likely to occur, so that received data may be incorrectly recognized.

DESCRIPTION OF THE INVENTION

The present invention has been made in view of the foregoing problems, and has a first object of providing coding techniques which allow for high efficiency in coding and easier synchronization with coded data. Further, it is a second object of the present invention to provide techniques which allow for reduction in errors in timing for regeneration of a pulse signal which has been generated at a transmitting end, at a receiving end.

In order to solve the above-described problems, a first example of a coding device according to the present invention includes a part for converting informational data of N (N≧2) bits into coded data of M (M≧2$^N$1) bits according to a predetermined coding rule, wherein according to the predetermined coding rule, one of 2$^N$ possible kinds of bit strings of the informational data is converted into alternately a bit string of M bits in which each of respective values of L (2≦L≦M) bits in successive bit positions is one of "0" and "1" and a bit string of M bits in which each of respective values of all bits is the other of "0" and "1"; and the other kinds of the 2$^N$ possible kinds of bit strings of the informational data are converted into bit strings of M bits which differ from one another, in each of which a value of only one bit or each of respective values of K (2≦K<L) in successive bit positions is the one of "0" and "1".

A second example of the coding device according to the present invention is the first example wherein a relationship of M≧2$^N$ is established in the predetermined coding rule, and the informational data is coded such that a value of a predetermined bit in the coded data is always the other of "0" and "1".

A third example of the coding device according to the present invention is the first or second example which further includes a part for converting the informational data into a bit string of M bits in violation of the predetermined coding rule.

A first example of a pulse regenerating device according to the present invention is intended to regenerate a first pulse signal which is generated at a transmitting end of a communications system, the pulse regenerating device being provided at a receiving end of the communications system, wherein the first pulse signal is converted into a plurality of second pulse signals having a predetermined period at the transmitting end and the second pulse signals are input to the pulse regenerating device through a transmission line, and the pulse regenerating device includes: a serial-parallel converter which detects input of a given second pulse signal, and outputs in parallel the second pulse signals including the given second pulse signal which are serially input for a predetermined time period from the time of detecting input of the given second pulse signal; a regeneration determiner for determining whether or not the first pulse signal is regenerated based on the number of the second pulse signals which are output in parallel from the serial-parallel converter; and a regenerated pulse supplier for generating a third pulse signal as a regenerated signal of the first pulse signal when the regeneration determiner determines that the first pulse signal is regenerated.

A second example of the pulse regenerating device according to the present invention is the first example wherein the serial-parallel converter outputs in parallel the second pulse signals after shaping the second pulse signals.

In the first or second example of the pulse regenerating device according to the present invention, it is preferable that each of the second pulse signals is an optical signal, the pulse regenerating device further comprises a photoelectrical converter for converting the second pulse signals into electrical signals, and the electrical signals into which the second pulse signals are converted are input to the serial-parallel converter.

A communications system according to the present invention includes: a transmitting device for generating a first pulse signal, converting the first pulse signal into a plurality of second pulse signals having a predetermined period, and outputting the second pulse signals; and a receiving device for regenerating the first pulse signal from the second pulse signals which are input from the transmitting device through a transmission line, wherein the receiving device includes: a serial-parallel converter which detects input of a given second pulse signal and outputs in parallel the second pulse signals including the given second pulse signal which are serially input for a predetermined time period from the time of detecting input of the given second pulse signal; a regeneration determiner for determining whether or not the first pulse signal is regenerated based on the number of the second pulse signals which are output in parallel from the serial-parallel converter; and a regenerated pulse supplier for generating a third pulse signal as a regenerated signal of the first pulse signal when the regeneration determiner determines that the first pulse signal is regenerated.

According to the first example of the coding device of the present invention, informational data of plural bits is coded at a time, which allows for higher efficiency in coding.

Further, when a certain kind of bit string of the informational data is coded, a bit string in which more bits successively represent the same value than bit strings obtained by coding the other kinds of bit strings of the informational data, can be obtained. Thus, with the use of the certain kind of bit string of the informational data, it is possible to detect a reference phase required for synchronization with coded data. Therefore, synchronization with the coded data can be easily achieved in decoding the coded data.

Further, even if informational data of N bits is successively coded, a value of a binary code in the resultant coded data varies without fail. Thus, errors in data in decoding the coded data can be reduced.

Further, with respect to the coded data, possible patterns of bit strings of M bits include a pattern which can not be generated according to the coding rule of the present invention. Thus, with the use of the pattern which can not be generated, it is possible to make error correction in decoding the coded data.

According to the second example of the coding device of the present invention, the value of the predetermined bit in the coded data does not vary. Thus, with the use of the predetermined bit, it is possible to detect a reference phase required for synchronization with the coded data in decoding the coded data. Therefore, synchronization with the coded data can be more easily achieved.

Further, a relationship of $M \geqq 2^N$ is established, the number of patterns which can not be generated according to the coding rule of the present invention, out of possible patterns of bit strings of M bits, is increased. Thus, it is possible to make sufficient error correction in decoding the coded data.

According to the third example of the coding device of the present invention, possible patterns of bit strings of M bits of the coded data include many patterns which can not be generated according to the coding rule of the present invention. Thus, it is possible to generate data in violation of coding rule by various methods.

According to the first example of the pulse regenerating device and the communications system of the present invention, it is determined whether or not the first pulse signal should be regenerated based on the number of the second pulse signals which are output in parallel from the serial-parallel converter. Accordingly, a determination as to regeneration of the first pulse signal can be made at a point in time when the second pulse signals which are serially input to the serial-parallel converter are output in parallel from the serial-parallel converter. Therefore, it is possible to reduce errors in timing for regeneration of the first pulse signal.

Further, since it is determined whether or not the first pulse signal should be regenerated based on the number of the second pulse signals, erroneous regeneration of the first pulse signal can be prevented even if an unnecessary pulse signal is caused on the transmission line. Also, even if the second pulse signal having a different pulse width is input, the first pulse signal can be regenerated. Further, even if some of the second pulse signals which are generated at the transmitting end vanish on the transmission line, the first pulse signal can be surely regenerated.

According to the second example of the pulse regenerating device of the present invention, the second pulse signal is output from the serial-parallel converter after being shaped. Thus, even if the pulse width of the second pulse signal varies on the transmission line, the regeneration determiner can exactly determine the number of the second pulse signals. Therefore, erroneous regeneration of the first pulse signal can be prevented.

These and other objects, features, aspects and advantages of the present invention will become more apparent from the following detailed description of the present invention when taken in conjunction with the accompanying drawings.

BRIEF DESCRIPTIONS OF DRAWINGS

FIG. 1 is a view for showing a coding device according to the first preferred embodiment of the present invention.

FIG. 2 is a view for showing a coding rule according to the first preferred embodiment of the present invention.

FIG. 3 is a view for showing a decoding device according to the first preferred embodiment of the present invention.

FIG. 4 is a view for showing a state in which coded data is decoded in the decoding device according to the first preferred embodiment of the present invention.

FIG. 5 is a view for showing another example of a coding rule according to the first preferred embodiment of the present invention.

FIG. 6 is a view for showing another example of a coding rule according to the first preferred embodiment of the present invention.

FIG. 7 is a view for showing another example of a coding rule according to the first preferred embodiment of the present invention.

FIG. 8 is a view for showing another example of a coding rule according to the first preferred embodiment of the present invention.

FIG. 9 is a view for showing another example of a coding rule according to the first preferred embodiment of the present invention.

FIG. 10 is a view for showing another example of a coding rule according to the first preferred embodiment of the present invention.

FIG. 15 is a view for showing a structure of an ESL server according to the first preferred embodiment of the present invention.

FIG. 16 is a view for showing an example of a product file.

FIG. 17 is a view for showing a structure of a communications device according to the first preferred embodiment of the present invention.

FIG. 18 is a view for showing a relationship between coded data and an infrared signal.

FIG. 22 is a view for showing a relationship between coded data and a pulse signal in a transmitting device according to the second preferred embodiment of the present invention.

FIG. 23 is a view for showing a structure of a pulse regenerating part according to the second preferred embodiment of the present invention.

FIG. 25 is a view for showing a structure of a regeneration determiner according to the second preferred embodiment of the present invention.

FIG. 26 is a view for showing a structure of a regenerated pulse supplier according to the second preferred embodiment of the present invention.

FIG. 41 is a view for showing a structure of another modification of the serial-parallel converter according to the second preferred embodiment of the present invention.

BEST MODE FOR CARRYING OUT THE INVENTION

First Preferred Embodiment

Figure 11:
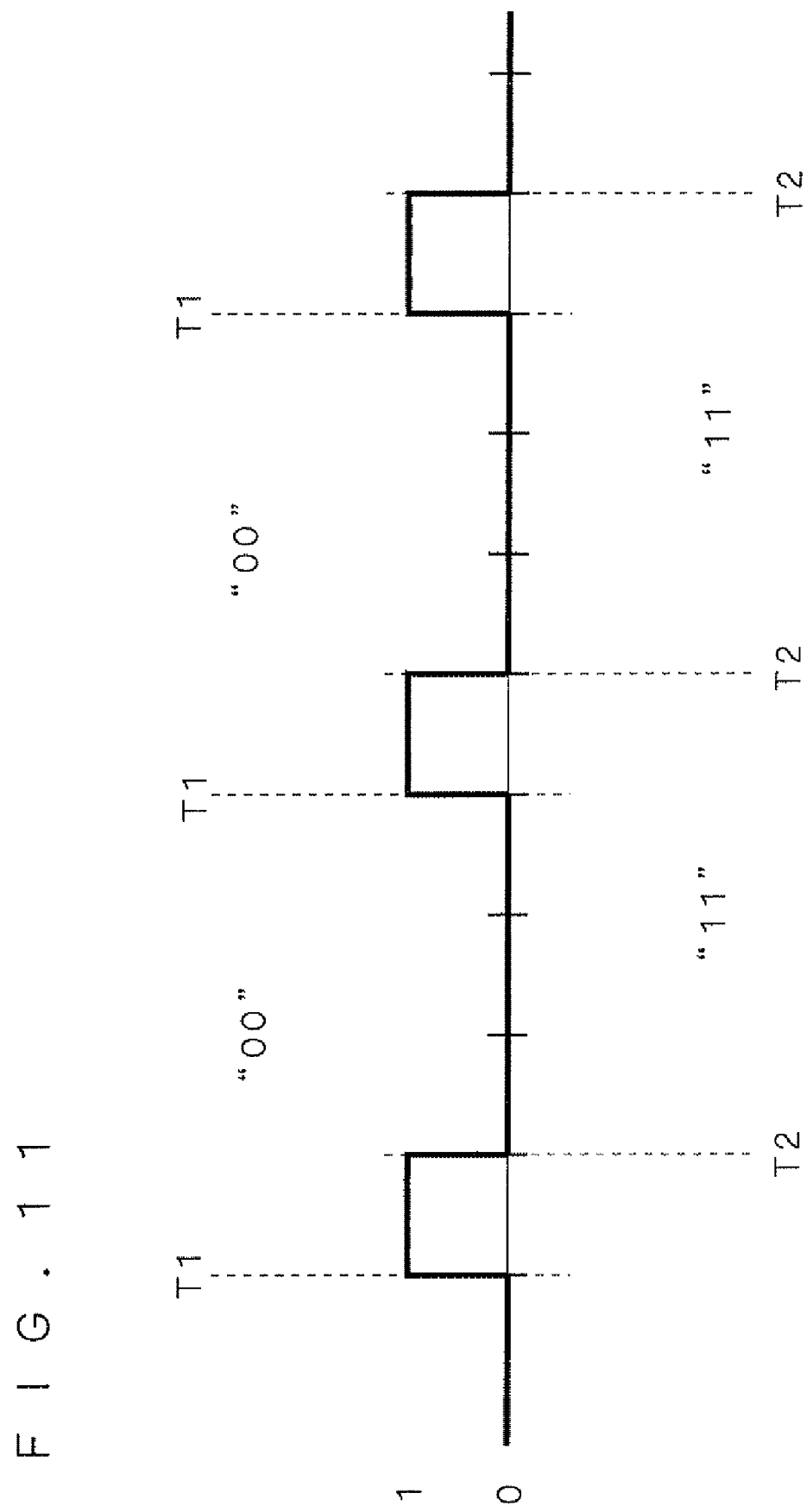
FIG. 11 is a view for showing data which is coded according to a conventional coding rule.

FIG. 1 is a view for showing a coding device 350 according to the first preferred embodiment of the present invention. As shown in FIG. 1, the coding device 350 according to the first preferred embodiment functions to convert 2-bit informational data IFD into 4-bit coded data CDD according to a predetermined coding rule.

FIG. 2 is a view for showing the coding rule used in the coding device 350. As shown in FIG. 2, according to the coding rule, a bit string "00" of the 2-bit informational data IFD is converted into a bit string "1000" formed of four bits, a bit string "01" is converted into a bit string "0100", and a bit string "10" is converted into a bit string "0010". Further, a bit string "11" of the informational data IFD is converted into alternately a bit string "1100" and a bit string "0000". More specifically, the coding device 350 converts a bit string "11" as input into a bit string "1100", converts a bit string "11" as secondly input into a bit string "0000", converts a bit string "11" as thirdly input into a bit string "1100", and thereafter operates in the same manner.

With respect to coded data CDD which is coded according to the foregoing rule, it is possible to obtain the informational data IFD by decoding the coded data CDD according to a rule reverse to the foregoing rule. FIG. 3 is a view for showing a decoding device 351 for decoding the coded data CDD. FIG. 4 is a view for showing how the coded data CDD is decoded in the decoding device 351. As shown in FIG. 4, in the decoding device 351, a bit string "1000" of the 4-bit coded data CDD is converted into a bit string "00" formed of two bits, a bit string "0100" is converted into a bit string "01", and a bit string "0010" is converted into a bit string "10". Further, both of a bit string "1100" and a bit string "0000" of the coded data CDD are converted into a bit string "11".

<Generalization of Coding Rule>

Next, the coding rule according to the present invention which is used for coding the informational data IFD of N (N≧2) bits in the coding device 350 will be described in a more generalized way. According to the present coding rule, the N-bit informational data IFD is converted into the coded data CDD of M (M≧$2^N$-1) bits. In the above preferred embodiment, the coding rule in a case where N=2 and M=4 has been described.

According to the present coding rule, any one kind out of $2^N$ possible kinds of bit strings of the N-bit informational data IFD is converted into alternately a bit string of M bits in which each of respective values of L (2≦L≦M) bits in successive bit positions is one of "0" and "1" and a bit string of M bits in which each of respective values of all bits is the other of "0" and "1". In the above-described preferred embodiment, out of four (=$2^2$) possible kinds of bit strings of the 2-bit informational data IFD, a bit string "11" is converted into alternately a bit string "1100" of four bits (M=4) in which each of respective values of successive two bits (L=2) in the highest bit position and the second highest bit position is "1" and a bit string "0000" of four bits in which each of respective values of all bits is "0".

Out of $2^N$ possible kinds of bit strings of the informational data IFD, the other kinds of bit strings than that cited above are converted into bit strings of M bits which differ from one another, in each of which a value of only one bit or each of respective values of K (2≦K<L) bits in successive bit positions is the one of "0" and "1" (out of "0" and "1", the same value of each of respective values of L bits in successive bit positions as described above). In the above-described preferred embodiment, out of four possible kinds of bit strings of the 2-bit informational data IFD, the other bit strings than the bit string "11", that is, the bit strings "00", "01", and "10" are respectively converted into different bit strings each of four bits, "1000", "0100", and "0010" in each of which a value of only one bit is "1". It is noted that N, M, and L are integers satisfying the above-described requirements.

FIGS. 5 through 10 show various preferred embodiments of the present coding rule. The preferred embodiment shown in FIG. 5 is different from the preferred embodiment shown in FIG. 2 only in that the informational data IFD of "11" is converted into "1111", not "1100". The preferred embodiment shown in FIG. 6 is different from the preferred embodiment shown in FIG. 2 only in that the informational data IFD of "11" is converted into "0010" and "10" is converted into alternately "1100" and "0000". In the preferred embodiment shown in FIG. 7, pieces of the informational data IFD of "00", "01", and "10" are converted into "1100", "0110", and "0011", respectively, and "11" is converted into alternately "1110" and "0000". In the preferred embodiment shown in FIG. 8, the 2-bit informational data IFD is converted into 3-bit coded data CDD. In the preferred embodiment shown in FIG. 8, pieces of the informational data IFD of "00", "01", and "10" are converted into "100", "010", and "001", respectively, and "11" is converted into alternately "111" and "000". In the preferred embodiment shown in FIG. 9, "1" and "0" in the coded data CDD are interchanged with each other, relative to the preferred embodiment shown in FIG. 2. In other words, in the preferred embodiment shown in FIG. 9, pieces of the informational data IFD of "00", "01", and "10" are respectively converted into "0111", "1011", and "1101", and "11" is converted into alternately "0011" and "1111". In the preferred embodiment shown in FIG. 10, 3-bit informational data IFD is converted into 8-bit coded data CDD. In the preferred embodiment shown in FIG. 10, pieces of the informational data IFD of "000", "001", "010", "011", "100", "101", and "110" are respectively converted into "10000000", "01000000", "00100000", "00010000", "00001000", "00000100", and "00000010", and "111" is converted into alternately "11110000" and "00000000".

<Effects of the Present Coding Rule>

As is made clear from the above description, the coding rule according to the present invention, in which the informational data IFD of N (N≧2) bits, in other words, plural bits, is coded at a time, provides for higher efficiency in coding than that in a CMI method in which 1-bit data is coded.

Further, according to the present coding rule, any one of $2^N$ possible kinds of bit strings of the N-bit informational data IFD is converted into a bit string of M bits in which each of respective values of L bits in successive bit positions is one of "0" and "1". As such, as a result of coding the one kind of bit string, a bit string including more bits which successively represent "1" can be obtained, as compared to a case in which the other kinds of bits strings are coded. For example, in the example shown in FIG. 2, as a result of coding a bit string "11" of the informational data IFD, a bit string "1100" in which higher two bits successively represent "1" is obtained, and the bit string thus obtained has a larger number of bits successively representing "1" than a bit string obtained by coding each of the other bit strings "00", "01", and "10" of the informational data IFD, in only one bit represents "1".

As described above, according to the present coding rule, as a result of coding a certain kind of bit string of the informational data IFD, a bit string which has a larger number of bits successively representing the same value than that obtained by coding any other kinds of bit strings. Therefore, it is possible to detect a reference phase which is required for synchronization with the coded data CDD by utilizing the certain kind of bit string. Detailed description in this respect will be made as below.

Now, consider a case where a coding rule according to which the informational data IFD of "11" is always converted into "0001" is employed in the example shown in FIG. 2, as a comparative example of the present coding rule. That comparative coding rule is called "four-level PPM". With respect to the coded data CCD obtained by using the comparative coding rule, only one bit represents "1" in each of all possible kinds of bit strings, so that all possible kinds of bit strings have the same number of bits representing "1". Accordingly, for decoding the coded data CCD, even if a signal of "1" is detected, a starting time of the coded data CCD of four bits can not be obtained with the use of the signal, to fail to achieve easy synchronization with the coded data CCD.

In decoding a bit string shown in FIG. 11 which is obtained by coding according to the comparative coding rule, for example, if a time T1 which is a rise time of the signal of "1" is regarded as a starting time of the 4-bit coded data CCD and is synchronized with the coded data CCD, the coded data CCD of "1000" is detected and the informational data IFD of "00" is obtained. On the other hand, if a time T2 which is a fall time of the signal of "1" is regarded as a starting time of the 4-bit coded data CCD, the coded data CCD of "0001" is detected and the informational data IFD of "11" is obtained. As such, according to the comparative coding rule, the informational data IFD varies depending on what time in a bit string which is to be decoded is regarded as a starting time. Thus, to simply detect a signal of "1" would not result in detection of a reference phase, so that synchronization with the coded data CCD can not be achieved. Such difficulties in achieving synchronization with the coded data CCD are disadvantageous because there is a need for synchronization with the coded data CCD in decoding the coded data CCD.

According to the present coding rule shown in FIG. 2, a rise time of a signal of "11" always serves as a starting time of the coded data CCD of four bits. As such, by detecting the signal of "11" and synchronizing the rise time of the signal of "11" as a reference phase, with the coded data CCD, it is possible to obtain the informational data IFD. Thus, easier synchronization with the coded data CCD can be achieved in decoding the coded data CCD.

Additionally, according to the coding rule shown in FIG. 2, even in a case where the informational data IFD of "11" is converted into not "1100", but "0110", a reference phase can be detected by using the signal of "11". For example, assuming that a transmission baud rate of a bit string which is to be decoded is F bits per second, a signal of "11" is detected from the bit string which is to be decoded, and a time which is (1/F) second ahead of a rise time of the signal is regarded as a starting time of the 4-bit coded data CDD. In this manner, the informational data IFD can be correctly recovered.

Further, according to the present coding rule, even in a case where the informational data IFD of N bits is successively coded, a value of a binary code changes in the resultant coded data CDD without fail, so that errors in data when decoding the coded CDD data can be reduced.

For example, assuming that the informational data IFD of "11" is always converted into "0000" according to the coding rule shown in FIG. 2, as a result of successively coding the informational data IFD of "11", a bit string in which each of all bits represents "0" is obtained. Since a value of a binary code does not change in the foregoing bit string, a starting time of the code data CDD can not be detected, resulting in difficulties in correct decoding of the coded data CDD.

In contrast, according to the coding rule shown in FIG. 2, the informational data IFD of "11" is converted into "1100" and "0000". As such, even in a case where the informational data IFD of "11" is successively coded, value of a binary code in a bit string obtained by the coding changes without fail. Therefore, a starting time of the coded data CDD can be detected, to thereby reduce errors in data in decoding the coded data CDD.

Figure 12:
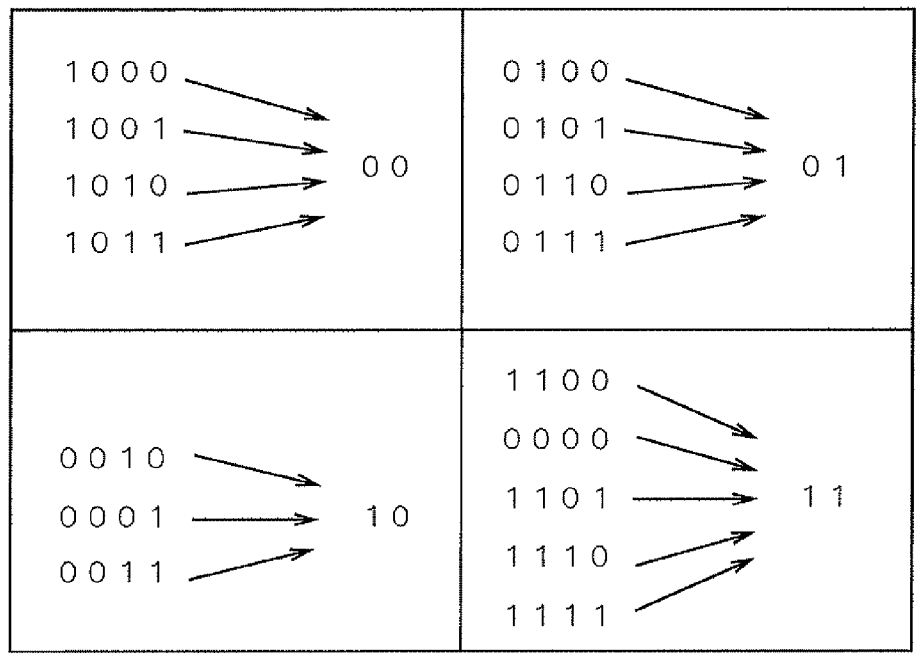
FIG. 12 is view for showing a state in which error correction is made on data which is coded according to the coding rule according to the first preferred embodiment of the present invention.

Further, possible patterns of bit strings of M bits of the coded data CDD include a pattern which can not be generated according to the present coding rule. As such, in decoding the coded data CDD, error correction can be made by using the pattern which cannot be generated according to the present coding rule. For example, with respect to the 4-bit coded data CDD, only five patterns of bit strings "1000", "0100", "0010", "1100", and "0000" are used in the coding rule shown in FIG. 2, while there are sixteen ($=2^4$) possible patterns of bit strings of four bits as a whole. Accordingly, error correction can be made by using the other eleven patterns, in decoding the coded data CDD. FIG. 12 shows one exemplary case where such error correction is made.

As shown in FIG. 12, not only a bit string "1000", but also each of bit strings "1001", "1010", and "1011", as a bit string which is to be decoded, is converted into "00". Also, not only a bit string "0100", but also each of bit strings "0101", "0110", and "0111", as a bit string which is to be decoded, is converted into "01". Further, not only a bit string "0010", but also each of bit strings "0001" and "0011", as a bit string which is to be decoded, is converted into "10". Moreover, not only each of bit strings "1100" and "0000", but also each of bit strings "1101", "1110", and "1111", as a bit string which is to be decoded, is converted into "11". Thus, in the example shown in FIG. 12, error correction for one bit or two bits can be made.

Additionally, it is preferable to code the informational data IFD such that a value of a predetermined bit in the coded data CDD always represents the other of "0" and "1" (i.e., out of "0" and "1", the value which is different from the value of each of the above-described L bits in successive bit positions), as in the examples shown in FIGS. 2 and 6 (the value of the least significant bit is fixed to "0" in FIGS. 2 and 6). In this manner, since a bit string of the coded data CDD always includes a bit representing an unchanging value, it is possible to detect a reference phase required for synchronization with the coded data CDD by using the bit representing an unchanging value, in decoding the coded data CDD. Thus, synchronization with the coded CDD can be more easily achieved. In the example shown in FIG. 2, for example, a value of the least significant bit is always "0", so that a signal of "0" is surely present every four bits in a bit string which is to be decoded. Therefore, by setting a reference phase with a timing which ensures that a signal of "0" is present every four bits, it is possible to correctly decode the coded data CDD.

Further, in a case where the informational data IFD is coded such that the value of a predetermined bit in the coded data CDD is always the other of "0" and "1", a relationship of "$M \geq 2^N$" is established, which results in an increase in the number of possible patterns of bit strings of M bits which can not be generated according to the present coding rule. For example, in the coding rules shown in FIGS. 2 and 6, the number of bits in the coded data CDD is set to be larger than that in the coding rule shown in FIG. 8. Accordingly, the number of patterns which can not be generated according to the coding rules in FIGS. 2 and 6 is larger than that according to the coding rule in FIG. 8. Therefore, sufficient error correction can be made in decoding the coded data CDD.

<Coding Rule Violation (CRV)>

In an optical transmission device described in the above-cited Patent document 3, a CMI method is employed as a method of coding informational data. In a CMI method, informational data of "1" is converted into alternately "11" and "00", and informational data of "0" is converted into "01". Such methods of generating data in violation of the foregoing coding rule include a method called "CRV0" and a method called "CRV1". In CRV0, data in violation of coding rule is generated by converting informational data of "0" into "10", not "01". On the other hand, in CRV1, data in violation of coding rule is generated by successively converting information data of "1" into either "11" or "00", instead of converting information data of "1" into alternately "11" and "00".

As is described above, informational data is converted into 2-bit coded data according to the coding rule in a CMI method. Thus, there is some limit to the number of employable methods of generating data in violation of coding rule to some degree.

According to the coding rule according to the present invention, the informational data IFD is converted into the coded data CDD of M bits and relationships of "$M \geq 2^N-1$" and "$N \geq 2$" are established, so that the informational data IFD is converted into the coded data of three or more bits. Also, with respect to the coded data CDD, there are many possible patterns of bit strings which can not be generated according to the present coding rule. Therefore, generation of data in violation of coding rule can be achieved by more various methods as compared to a case in which data in violation of coding rule in a CMI method is generated. Below, a method of generating data in violation of coding rule will be specifically described by taking the coding rule shown in FIG. 2 as an example.

In the above-described coding device 350, for example, data in violation of coding rule can be generated by converting the informational data IFD of "00" which is supposed to be converted into "1000" under normal conditions, into "1001", for example. In the decoding device 351, not only the coded data CDD of "1000", but also the coded data CDD of "1001", is converted into the informational data IFD of "00". As a result, the informational data IFD of "00" which has a given special significance, such as a frame sync signal, can be input to the decoding device 351, distinctly from the other pieces of informational data IFD of "00".

In an alternative example, data in violation of coding rule can be generated by converting the informational data IFD of "01" which is supposed to be converted into "0100" under normal conditions, into "0101", for example.

In another alternative example, data in violation of coding rule can be generated by converting the informational data IFD of "10" which is supposed to be converted into "0010" under normal conditions, into "0011", for example.

In another alternative example, data in violation of coding rule can be generated by converting the informational data IFD of "11" which is supposed to be converted into "1100" under normal conditions, into "1101", for example.

In another alternative example, data in violation of coding rule can be generated by converting the informational data IFD of "11" which is supposed to be converted into "0000" under normal conditions, into "0001", for example.

In another alternative example, data in violation of coding rule can be generated by converting the informational data IFD of "11" which is supposed to be converted into alternately "1100" and "0000" under normal conditions, successively into either "1100" or "0000", for example.

<Application of Present Invention>

Next, an example of a system which employs the coding device 350 and the decoding device 351 according to the present invention will be described. The following description will deal with a case where the coding device 350 and the decoding device 351 according to the present invention are used in an electronic shelf label (ESL) system which is introduced into supermarkets, convenience stores, and the like.

Figure 13:
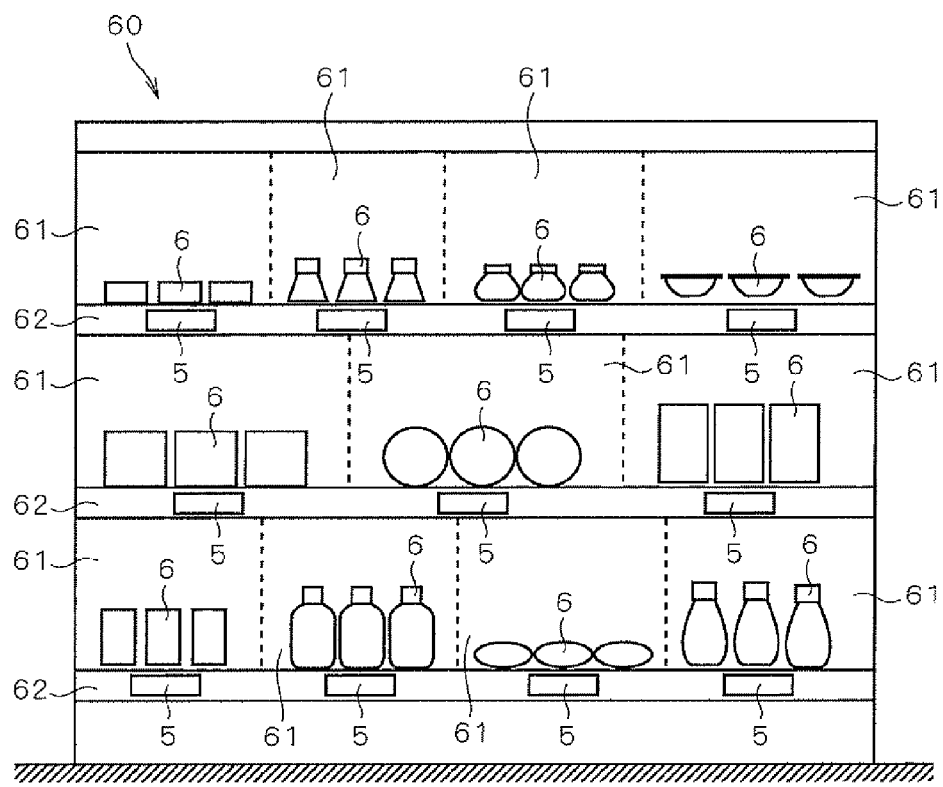
FIG. 13 is a view for showing a state in which electronic shelf labels in an electronic shelf label system according to the first preferred embodiment of the present invention are located.

FIG. 13 is a view for showing a state in which electronic shelf labels included in an electronic shelf label system according to the first preferred embodiment are located in shelves of a store. In the electronic shelf label system, portable electronic shelf labels which display product information such as selling prices are located so as to respectively correspond to products. Then, a communications signal including a selling price based on a product master is transmitted from a distribution device for distributing information to each of the electronic shelf labels, on which the selling price is displayed. As a result, a correct selling price which matches a selling price which is supposed to be provided at the time of checkout is displayed on each of the electronic shelf labels, so that a correct selling price is indicated to customers.

As shown in FIG. 13, a shelf 60 is partitioned into spaces each of which is called a face 61, where the same kinds of products 6 are gathered and placed. Onto a frame 62 of the shelf 60, the electronic shelf labels 5 are attached in positions respectively corresponding to the faces 61. That is, each of the electronic shelf labels 5 corresponds to a single product (exactly, a single kind of products) 6, and is located onto the frame 62 near the corresponding product 6 (in most cases, below the corresponding product 6). Each of the electronic shelf labels 5 includes a display part, and the display part displays a selling price of the corresponding product 6. Customers (consumers) of a store become aware of selling prices of the products 6 through such display of the electronic shelf labels 5 as described above.

Each of the electronic shelf labels 5 is a portable device, and can be detached from the frame 62 to be relocated in a different position, to keep up with a location change of the product 6. According to the first preferred embodiment, a plurality of shelves configured like the shelf 60 as shown in FIG. 13 are placed on a selling floor of a store.

Figure 14:
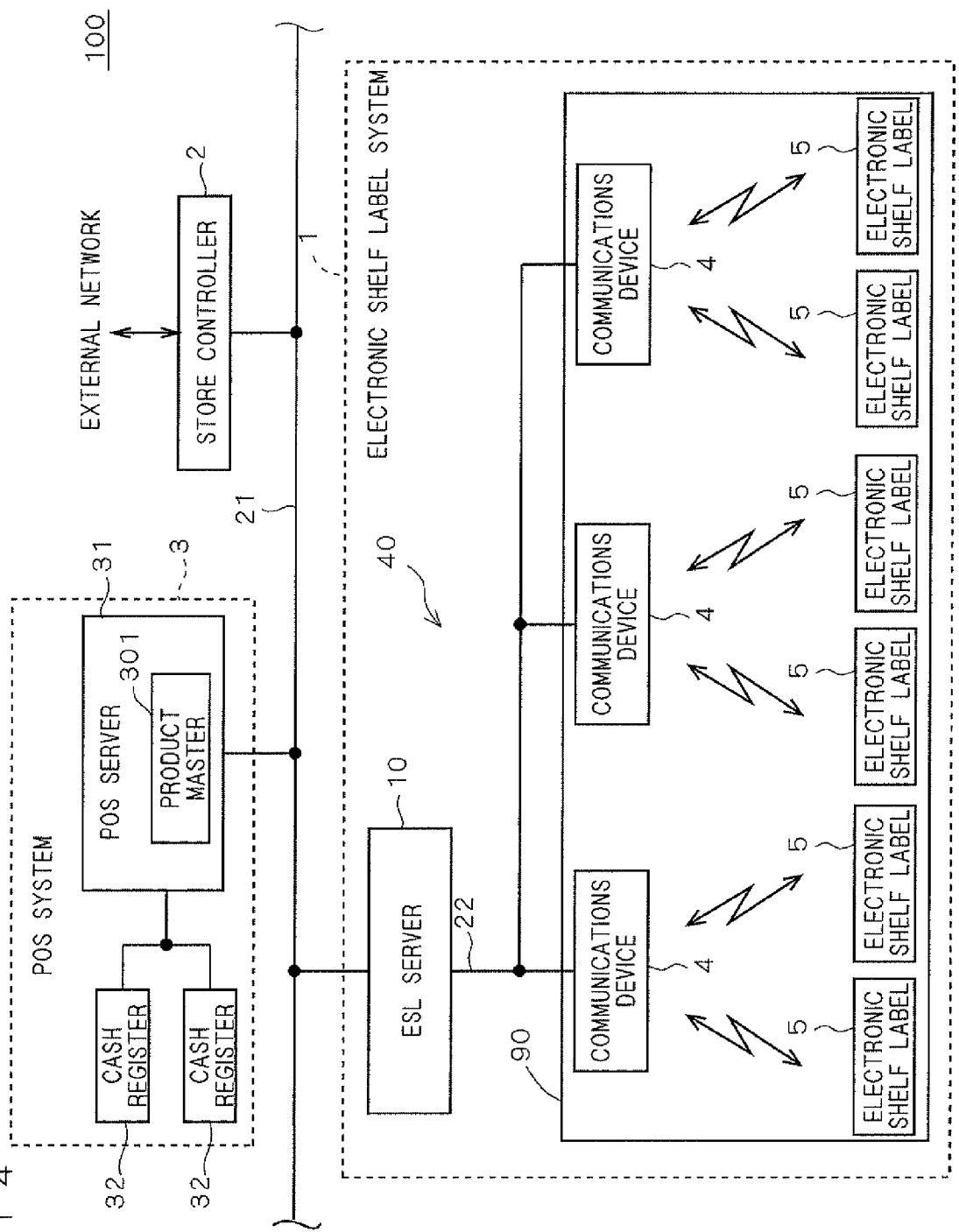
FIG. 14 is a view for showing an example of a structure of a store information system including the electronic shelf label system according to the first preferred embodiment of the present invention.

FIG. 14 is a view for showing an example of a structure of a store information system 100 including an electronic shelf label system 1, which is applied to a store. As shown in FIG. 14, the store information system 100 includes a store controller 2 and a POS system 3 in addition to the electronic shelf label system 1. A POS server 31 included in the POS system 3 and an ESL server 10 included in the electronic shelf label system 1 are connected to the store controller 2 via a LAN 21. This allows data transmission among the store controller 2, the POS system 3, and the electronic shelf label system 1.

The store controller 2 is formed of a typical computer, and functions as a device which totally controls the store information system 100. Also, the store controller 2 is connected to an external network such as Internet, and is allowed to communicate with computers such as servers, which are installed in a head office that manages a store, via an external network.

The POS system 3 is a system which collects and analyzes information regarding sale of products at the time of selling the products. The POS system 3 includes a plurality of cash registers 32 for performing checkout procedures of products, in addition to the POS server 31 which totally controls the POS system 3. The POS server 31 and the cash registers 32 are connected with each other via a dedicated communications cable.

The POS server 31 is formed of a typical computer, and contains a hard disk in which a product master 301 indicating a variety of information regarding products such as selling prices is stored. In each of the plurality of cash registers 32, checkout procedures of products are performed based on selling prices listed in the product master 301.

Information regarding all products in a store are under centralized control with the use of the product master 301. Information listed in the product master 301 includes "product codes" which are identification information of products, "product names" which are names of products, "regular prices" which are selling prices in normal times, "bargain prices" which are selling prices provided at the time of bargain sale, a "bargain period" which is a period for bargain sale, and the like.

The electronic shelf label system 1 is roughly divided into the plurality of electronic shelf labels 5 which have been described above and a distribution device 40 for distributing "selling prices" of products which should be displayed on the electronic shelf labels 5.

The distribution device 40 includes the ESL server 10 which is a server for totally controlling the ESL system 1 and a plurality of communications devices 4. The ESL server 10 and the communications devices 4 are connected with each other via a dedicated communications cable 22, so that data can be communicated between the ESL server 10 and the communications devices 4. Each of the communications devices 4 performs infrared communication with the electronic shelf labels 5. The communications devices 4 are placed on a ceiling of a selling floor or the like at substantially regular intervals so that the communications devices 4 can communicate with all the electronic shelf labels 5 located in the selling floor.

A structure of the ESL server 10 as a hardware is similar to that of a typical computer. FIG. 15 is a view for showing a structure of the ESL server 10. The ESL server 10 includes a CPU 11 which performs various computations, a ROM 12 which stores a basic program, a RAM 13 serving as a workspace of computations, a hard disk 14 which stores programs, various data files, and the like, a display device 15 which displays a variety of information, an input part 16 which includes a keyboard, a mouse, and the like, a data communications part 17 which has a function of communicating data via the LAN 21, and an interface 18 for communicating with the communications devices 4. Signals indicating "selling prices" which should be transmitted to the electronic shelf labels 5 are transmitted to the communications devices 4 via the interface 18.

A dedicated program is previously stored in the hard disk 14 of the ESL server 10, and the CPU 11 performs computations in accordance with the dedicated program, so that various functions of the ESL server 10 are implemented. Also, the hard disk 14 of the ESL server 10 stores a product file 101 which is a data file indicating a variety of information regarding products (product data).

FIG. 16 is a view for showing an example of the product file 101. As shown in FIG. 16, the product file 101 is in tabular form, in which each record 102 indicates information regarding a single product. More specifically, a "product code", a "product name", a "regular price", a "bargain price", a "bargain period", and the like are stored for each record 102. Such information is identical to that in the above-described product master 301 stored in the POS system 3, and is stored based on information in the product master 301 through communication between the ESL server 10 and the POS system 3. Accordingly, details of information in the product file 101 and details of information in the product master 301 match each other.

Each record 102 of the product file 101 further stores a "device code" which is a hardware ID unique to each of the electronic shelf labels 5 included in the electronic shelf label system 1. As a result, products and the electronic shelf labels 5 are in one-to-one correspondences (are linked with each other) in the form of data. With the use of the "device code", a "selling price" of a given product is transmitted to one of the electronic shelf labels 5 which corresponds to the given product.

Next, the communications devices 4 will be described in detail. FIG. 17 is a view for showing a structure of each of the communications devices 4. As shown in FIG. 17, each of the communications devices 4 includes the above-described coding device 350, the above-described decoding device 351, a driving part 41, an infrared light emitting element 42 formed of an LED, an infrared light receiving element 43 formed of a photodiode, and a data regenerating part 44.

The coding device 350 codes data indicating a "selling price" which is provided from the ESL server 10 according to the above-described coding rule, and outputs the coded data to the driving part 41. The driving part 41 drives the infrared light emitting element 42 based on the coded data as input. As a result, the infrared light emitting element 42 outputs an infrared signal IR1 which is modulated by the coded data provided from the coding device 350.

FIG. 18 is a view for showing a relationship between the coded data output from the coding device 350 and the infrared signal IR1. As shown in FIG. 18, the infrared light emitting element 42 operates such that it flashes at a predetermined frequency while a binary code of the coded data is indicating "1", and goes out while a binary code of the coded data is indicating "0". In an example shown in FIG. 18, the infrared light emitting element 42 lights up four times while 1-bit data in the coded data is indicating "1". Accordingly, if pieces of 2-bit data in the coded data successively indicate "1", the infrared light emitting element 42 lights up eight times.

The infrared light receiving element 43 receives an infrared signal IR2 which is output from the electronic shelf label 5, and converts the received infrared signal IR2 into an electrical signal ES, which is then output to the data regenerating part 44. The data regenerating part 44 amplifies the received electrical signal ES, regenerates the coded data which is generated in the electronic shelf label 5 based on the amplified electrical signal ES, and outputs the regenerated coded data to the decoding device 351. The decoding device 351 decodes the coded data as input and outputs the decoded data to the ESL server 10. It is noted that, the coding rule according to the present invention is used for generation of the coded data also in the electronic shelf label 5, which will also be described later.

Figure 19:
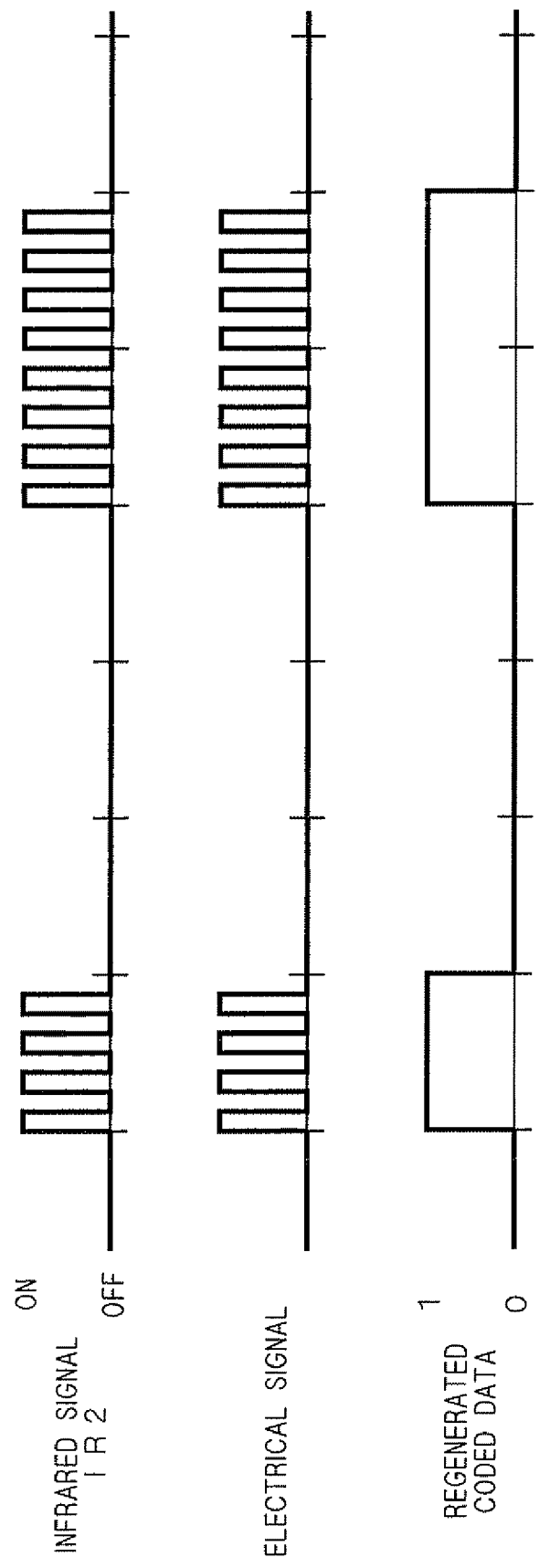
FIG. 19 is a view for showing a relationship among an infrared signal, an electrical signal, and coded data.

FIG. 19 is a view for showing a relationship among the infrared signal IR2, the electrical signal ES, and the coded data which is regenerated by the data regenerating part 44. As shown in FIG. 19, the infrared light receiving element 43 outputs the electrical signal ES which has the same waveform as the infrared signal IR2 fed from the electronic shelf label 5, and the data regenerating part 44 regenerates the coded data which is generated in the electronic shelf label 5, based on the electrical signal ES.

Figure 20:
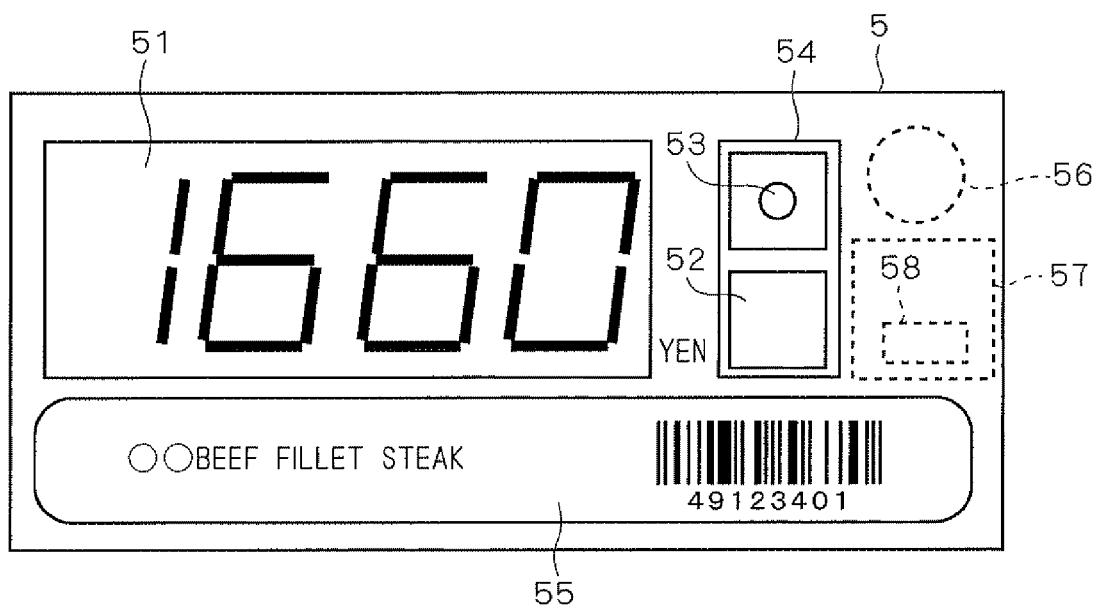
FIG. 20 is a view for showing a structure of the electronic shelf label according to the first preferred embodiment of the present invention.

Next, the electronic shelf label 5 will be described. FIG. 20 is a view for showing a structure of the electronic shelf label 5. As shown in FIG. 20, in a front surface of the electronic shelf label 5, a display part 51 for displaying a "selling price" of a product and a communications part 54 responsible for communication with the distribution device 40 are provided. The display part 51 is formed of a liquid crystal display of a dot matrix type, for example.

The communications device 54 includes an infrared light emitting element 52 for transmitting the infrared signal IR2 and an infrared light receiving element 53 for receiving the infrared signal IR1 from the communications device 4. The infrared light emitting element 52 is formed of an LED, for example. The infrared light receiving element 53 is formed of a photodiode, for example, and converts the infrared signal IR1 into an electrical signal.

Onto a lower portion of the display part 51, an overlay label 55 on which a "product name" and a bar code indicating a "product code" of a product corresponding to the electronic shelf label 5 is printed is put. If a label or the like is not put on the electronic shelf label 5, it is difficult to see which of products corresponds to the electronic shelf label 5. However, as a result of provision of the overlay label 55, the electronic shelf label 5 and a product visually correspond to each other.

Also, the electronic shelf label 5 includes a compact battery 56 for supplying driving power and a control part 57 formed of an integrated circuit for controlling operations of a device inside the electronic shelf label 5. The control part 57 includes the above-described coding device 350 and the above-described decoding device 351, and further includes a driving part and a data regenerating part which operate in the same manner as the communications device 4, though those cited components are not shown. The control part 57 amplifies an electrical signal output from the infrared light receiving element 53 in the data regenerating part, regenerates the coded data which is generated in the communications device 4 based on the amplified electrical signal, and decodes the regenerated coded data in the decoding device 351, to thereby acquire data indicating a "selling price". Further, the control part 57, upon receipt of the data indicating a "selling price", generates data indicating the receipt, and codes the generated data in the coding device 350. Then, the control part 57 drives the infrared light emitting element 52 based on the code data generated in the coding device 350 with the use of the driving part, and outputs the infrared signal IR2 from the infrared light emitting element 52. Moreover, the control part 57 includes a memory 58 for storing a variety of information. The memory 58 stores data indicating a "selling price" which is obtained based on the infrared signal IR1, data indicating a device code of its own device, and the like. The control part 57 reads out the data indicating a "selling price" from the memory 58, and controls the display part 51 based on the read data. As a result, a "selling price" is displayed on the display part 51.

Next, a series of operations of the electronic shelf label system 1 for achieving display of a selling price on the electronic shelf label 5 will be described. In the electronic shelf label system 1 according to the first preferred embodiment, a "selling price" is distributed from the distribution device 40 to each of the electronic shelf labels 5 at the time of start-up of the system, at the time of updating a "selling price" which is to be displayed on the electronic shelf label 5, and at the other like times. It is noted that updating of a "selling price" is needed when a regular price listed in the product master 301 is changed or when a selling price is changed from a regular price to a bargain price for bargain sale. At the time of start-up of the system, "selling prices" of all products in a store are distributed. On the other hand, at the time of updating a "selling price", only "selling prices" of products, which should be updated, are distributed. As a result, "selling prices" displayed on the electronic shelf labels 5 always match "selling prices" which are supposed to be provided at the time of checkout in the cash registers 32. The following description will deal with operations for distributing a "selling price" of one given product. In the following description, a product, of which selling price should be distributed, will be referred to as a "target product".

First, the record 102 regarding the target product in the product file 101 is referred to, and a "selling price" which is either a "regular price" or a "bargain price" that should be distributed, and a "device code" are acquired, in the ESL server 10 of the distribution device 40. The thus acquired "device code" is a "device code" of one of the electronic shelf labels 5 which corresponds to the target product, and the acquired "selling price" is a "selling price" which should be displayed on the one electronic shelf label 5. The acquired "selling price" and "device code" are transmitted as electrical signals to the communications device 4 via the communications cable 22.

The signals indicating the "selling price" and the "device code" are coded in the communications device 4. The communications device 4 controls the infrared light emitting element 52 based on resultant coded data. As a result, the communications device 4 outputs the infrared signal IR1 including information about the "selling price" and the "device code".

The infrared signal IR1 output from the communications device 4 is received by the communications part 54 of the electronic shelf label 5 and converted into an electrical signal. The control part 57 regenerates the coded data which is generated in the communications device 4, based on the electrical signal obtained in the communications part 54, and decodes the coded data, to thereby acquire data indicating the "selling price" and the "device code".

Subsequently, the control part 57 determines whether or not the acquired "device code" matches a device code of its own device which has been previously stored in the memory 58. If the acquired "device code" does not match the device code of its own device, the received infrared signal IR1 is determined to be a signal for the other electronic shelf label 5, to terminate a process.

On the other hand, if the acquired "device code" matches the device code of its own device, the received infrared signal IR1 is determined to be a signal for its own device, and display of the display part 51 is updated by the control part 57 based on the acquired "selling price".

By the above-described operations, distribution of a "selling price" from the distribution device 40 to the electronic shelf label 5 is achieved.

After display of the display part 51 is updated, the infrared signal IR2 including information indicating successful receipt of the data indicating the "selling price" is output from the infrared light emitting element 52 of the electronic shelf label 5. The infrared signal IR2 is received by the communications device 4, and the information included in the infrared signal IR2 is transmitted to the ESL server 10. As a result, the ESL server 10 of the distribution device 40 can confirm whether or not the data indicating the "selling price" is successfully received by the electronic shelf label 5. Thus, when the infrared signal IR2 is not output from the electronic shelf label 5, for example, the ESL server 10 determines that the data indicating the "selling price" is not successfully received by the electronic shelf label 5, and is allowed to perform a process of repeatedly outputting the data indicating the "selling price" or the other like processes until the infrared signal IR2 is received. In this manner, display on the electronic shelf label 5 can be surely updated, resulting in considerable improvement in reliability of the system.

As described above, as a result of use of the coding method according to the present invention in communication of information between the distribution device 40 and the electronic shelf label 5, a rate of data transmission between the distribution device 40 and the electronic shelf label 5 can be considerably improved. In particular, in a case where a display of a dot matrix type is employed as the display part 51 of the electronic shelf label 5, an amount of displayed data is significantly increased as compared to a case where a segment display is employed. As such, to employ the coding method according to the present invention in communication of information between the distribution device 40 and the electronic shelf label 5 would bring about remarkable effects.

It is additionally noted that though the above description has dealt with a case where the coding method according to the present invention is applied to an electronic shelf label system as an example, the coding method according to the present invention is applicable to the other systems, of course.

Second Preferred Embodiment

Figure 21:
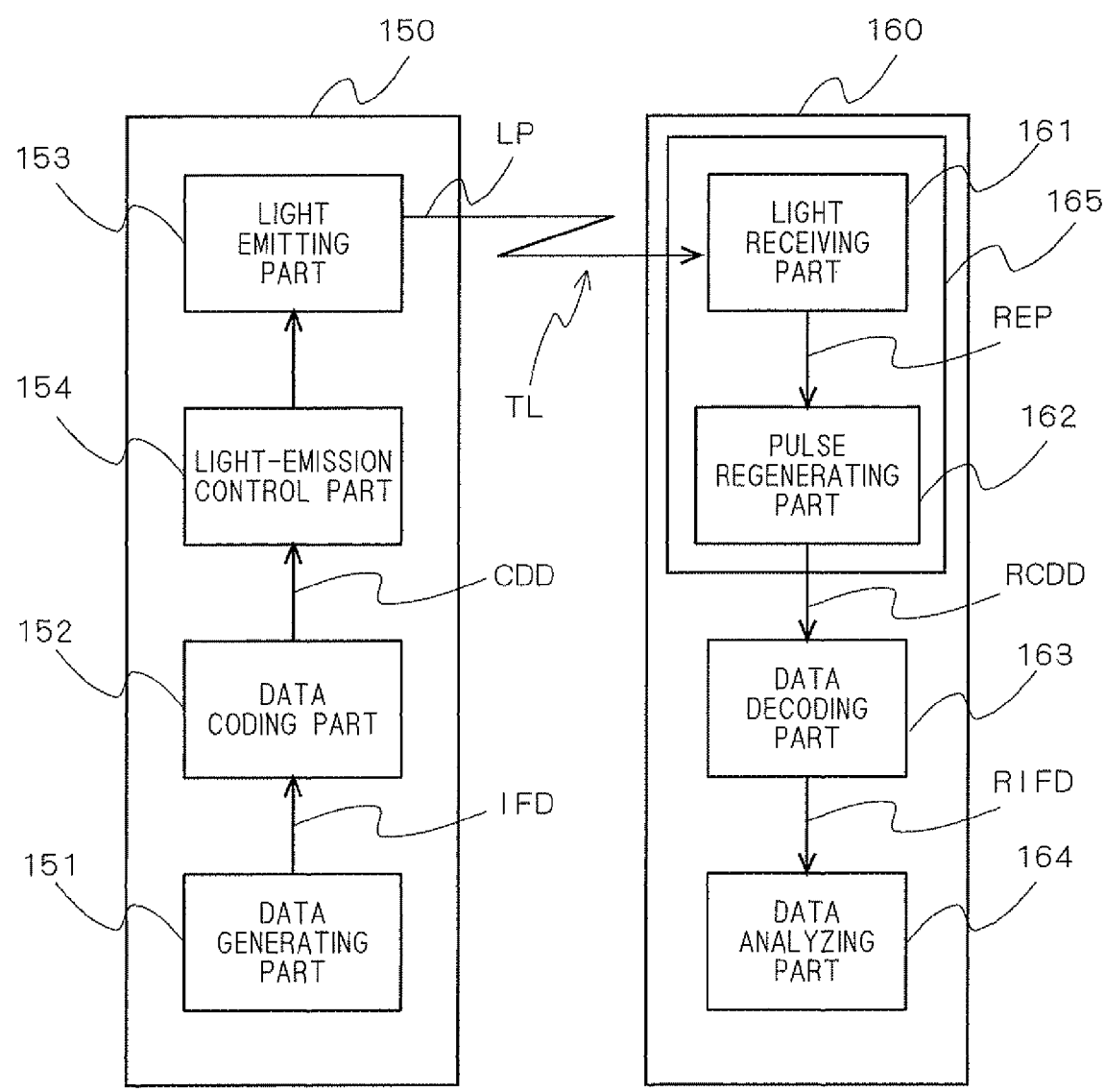
FIG. 21 is a view for showing a structure of a communications system according to the second preferred embodiment of the present invention.

FIG. 21 is a view for showing a structure of a communications system according to the second preferred embodiment of the present invention. The communications system according to the second preferred embodiment is an optical communications system, for example. As shown in FIG. 21, the communications system according to the second preferred embodiment includes a transmitting device 150, and a receiving device 160 for receiving an optical signal transmitted from the transmitting device 150.

The transmitting device 150 includes a data generating part 151 for generating data which is to be transmitted to the receiving device 160, a data coding part 152 for coding data generated in the data generating part 151 according to a predetermined coding rule, a light emitting part 153 for outputting light, and a light-emission control part 154 for controlling the light emitting part 153 based on data which is coded in the data coding part 152.

The data generating part 151 generates binary data and outputs the generated binary data to the data coding part 152, as the informational data IFD. The data coding part 152 generates the coded data CDD by coding the informational data IFD according to the same coding rule that is employed in the coding device 350 according to the first preferred embodiment, and outputs the coded data CDD. The data coding part 152 employs the coding rule shown in FIG. 2, for example.

With respect to the coded data CDD which is obtained by coding according to the coding rule shown in FIG. 2, it is possible to obtain the informational data IFD by decoding the data according to a rule reverse to the coding rule as described above with reference to FIG. 4.

The light emitting part 153 is formed of an LED, for example, and outputs a pulse signal LP composed of infrared light under the control of the light-emission control part 154 based on the coded data CDD. Additionally, the other kinds of pulse signals such as a pulse signal composed of visible light or a pulse signal composed of ultraviolet light may alternatively be output from the light emitting part 153.

FIG. 22 is a view for showing a relationship between the coded data CDD and the pulse signal LP. In the data coding part 152, each of bit strings "00", "01", and "10" in the informational data IFD is converted into a bit string of four bits in which only one bit represents "1" as described above with reference to FIG. 2. Thus, a pulse signal EPS formed of an electrical signal in which only one bit represents "1" is output from the data coding part 152. Also in the data coding part 152, a bit string "11" in the informational data IFD is converted into a bit string of four bits in which only two bits represent "1". Thus, a pulse signal EPL formed of an electrical signal in which only two bits represent "1" is output from the data coding part 152. That is, the data coding part 152 generates two kinds of pulse signals of the pulse signal EPS having a small pulse width and the pulse signal EPL having a large pulse width. Hereinafter, the pulse signal EPS and the pulse signal EPL will be referred to as a "short pulse signal EPS" and a "long pulse signal EPL", respectively.

In the second preferred embodiment, while the short pulse signal EPS is input to the light-emission control part 154, a plurality of pulse signals LP each having a period T are output from the light emitting part 153 under the control of the light-emission control part 154 over the light emitting part 153. Likewise, while the long pulse signal EPL is input to the light-emission control part 154, a plurality of pulse signals LP each having a period T are output from the light emitting part 153 under the control of the light-emission control part 154 over the light emitting part 153.

Now, assume that the pulse width EPWS of the short pulse signal EPS is set to (NS×T) and the pulse width EPWL of the long pulse signal EPL is set to (NL×T). Each of "NS" and "NL" is an integer equal to or larger than three, and a relationship of "NS<NL" is established. The light emitting part 153 lights up the number of times smaller than NS with the period T while the short pulse signal EPS is input to the light-emission control part 154. As a result, a pulse number PNS which is the number of the pulse signals LP output from the light emitting part 153 while the short pulse signal EPS is input to the light-emission control part 154 is smaller than NS. Likewise, the light emitting part 153 lights up the number of times smaller than NL with the period T while the long pulse signal EPL is input to the light-emission control part 154. As a result, a pulse number PNL which is the number of the pulse signals LP output from the light emitting part 153 while the long pulse signal EPL is input to the light-emission control part 154 is smaller than NL.

As described above, as a result of control of the light-emission control part 154 over the light emitting part 153 based on the coded data CDD, the short pulse signal EPS is converted into the pulse signals LP, the number of which is smaller than NS, and the long pulse signal EPL is converted into the pulse signals LP, the number of which is smaller than NL. Then, the plurality of pulse signals LP are serially output to a transmission line TL provided between the transmitting device 150 and the receiving device 160. According to the second preferred embodiment, NS is equal to four, so that the short pulse signal EPS is converted into (NS−1) pulse signals LP, that is, three pulse signals LP, as shown in FIG. 22. On the other hand, with respect to the long pulse signal EPL, NL is equal to eight, so that the long pulse signal EPL is converted into (NL−1) pulse signals LP, that is, seven pulse signals LP.

As is made clear from the foregoing description, as a result of conversion of the short pulse signal EPS having a pulse width of (NS×T) into the pulse signals LP, the number of which is smaller than NS, the pulse number PNS regarding the pulse signals LP at that time is relatively small. Likewise, as a result of conversion of the long pulse signal EPL having a pulse width (NL×T) into the pulse signals LP, the number of which is smaller than NL, the pulse number PNL regarding the pulse signals LP at that time is relatively small. Therefore, a time period of light emission in the light emitting part 153 is shortened, to thereby reduce power consumption of the transmitting device 150.

Next, the receiving device 160 will be described in detail. As shown in FIG. 21, the receiving device 160 includes a pulse regenerating device 165, a data decoding part 163, and a data analyzing part 164. The pulse regenerating device 165 includes a light receiving part 161 and a pulse regenerating part 162, and regenerates the short pulse signal EPS and the long pulse signal EPL which are generated in the transmitting device 150 based on the pulse signals LP fed from the transmitting device 150.

The light receiving part 161 receives the pulse signals LP fed from the transmitting device 150 via the transmission line TL. The light receiving part 161 is formed of a photodiode and an amplifier, for example, and converts the received pulse signals LP into electrical signals to output them serially, as pulse signals REP, to the pulse regenerating part 162. Thus, the light receiving part 161 functions as a photoelectrical converter which converts the pulse signals LP which are optical pulse signals, into electrical signals.

The pulse regenerating part 162 regenerates the short pulse signal EPS and the long pulse signal EPL based on the input pulse signals REP, and outputs the short pulse signal EPS and the long pulse signal EPL to the data decoding part 163. Since regeneration of the short pulse signal EPS and the long pulse signal EPL would result in regeneration of the coded data CDD which is generated in the transmitting device 150, the coded data CDD is regenerated in the pulse regenerating part 162. Then, the regenerated data is input as a regenerated coded data RCDD to the data decoding part 163.

The data decoding part 163 has the same functions as the above-described decoding device 351, and thus, decodes the regenerated coded data RCDD according to the coding rule described above with reference to FIG. 4, to output the decoded data to the data analyzing part 164. As a result, the informational data IFD which is generated in the transmitting device 150 is regenerated in the data decoding part 163, and the regenerated data is input as regenerated informational data RIFD to the data analyzing part 164. The data analyzing part 164 analyzes details of the regenerated informational data RIFD, and operates in accordance with the details. For example, in a case where the receiving device 160 is provided with a display device, a predetermined image is displayed on the display part. Otherwise, in a case where the receiving device 160 is provided with a speaker, a predetermined sound is output from the speaker. Thus, the receiving device 160 can operate as required by the transmitting device 150.

The pulse regenerating part 162 will be described in detail. FIG. 23 is a view for showing a structure of the pulse regenerating part 162. As shown in FIG. 23, the pulse regenerating part 162 includes a serial-parallel converter 170 for outputting in parallel the pulse signals REP which are serially input, a regeneration determiner 171 for determining whether or not the short pulse signal EPS and the long pulse signal EPL should be regenerated based on the pulse signals REP which are output in parallel from the serial-parallel converter 170, and a regenerated pulse supplier 172 for generating a pulse signal having a predetermined pulse width and outputting the generated pulse signal as a regenerated signal of the short pulse signal EPS or the long pulse signal EPL.

Figure 24:
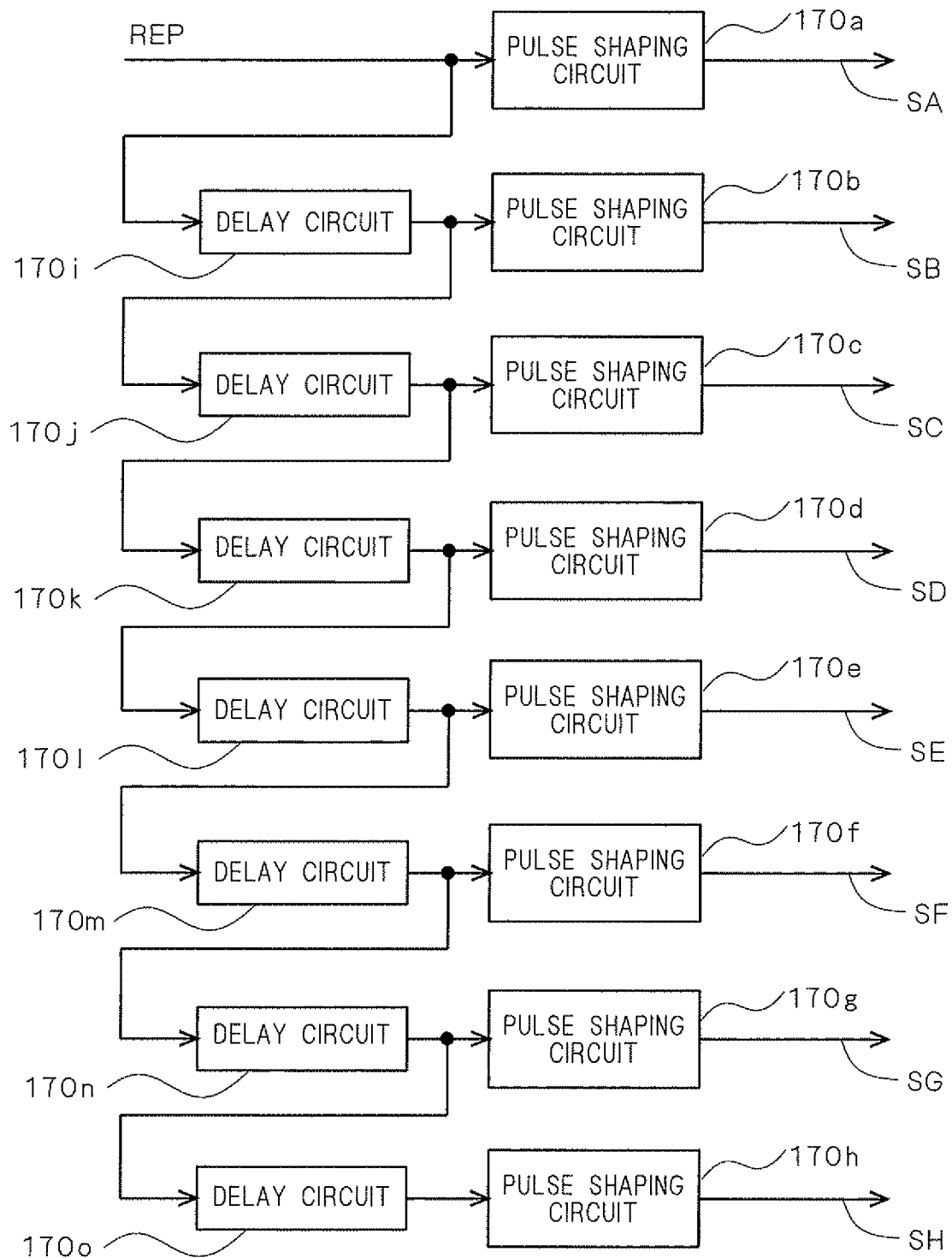
FIG. 24 is a view for showing a structure of a serial-parallel converter according to the second preferred embodiment of the present invention.

FIG. 24 is a view for showing a structure of the serial-parallel converter 170. As shown in FIG. 24, the serial-parallel converter 170 includes pulse shaping circuits 170a through 170h and delay circuits 170i through 170o. Each of the pulse shaping circuits 170a through 170h, in response to input of a pulse signal, shapes the input pulse signal so as to have a predetermined pulse width Pw, and outputs it. In each of the pulse shaping circuits 170a through 170h, even if any other input signal is present while a given pulse signal is being output, the input signal is disregarded so that no pulse signal is generated based thereon.

Each of the delay circuits 170i through 170o outputs an input signal which is delayed by a predetermined time period. In the second preferred embodiment, each of the delay circuits 170i through 170o outputs an input signal which is delayed by (2×Pw).

The pulse signals REP are serially input to each of the pulse shaping circuit 170a and the delay circuit 170i. Respective outputs of the delay circuits 170i through 170n are provided to the delay circuits 170j through 170o, respectively. Then, respective outputs of the delay circuits 170j through 170o are provided to the pulse shaping circuits 170b through 170h, respectively. In the serial-parallel converter 170, the pulse shaping circuit 170a is the first member that receives the pulse signals REP, and thus, input of the pulse signals REP to the serial-parallel converter 170 can be detected in the pulse shaping circuit 170a.

Now, remember that the pulse width of the pulse signal LP which is generated in the light emitting part 153 of the transmitting device 150 is set to Pw, and also, the period T of the pulse signal LP is set to (2×Pw), in the second preferred embodiment. Accordingly, without any change in the pulse width while the pulse signal LP is passing through the transmission line TL, the pulse signal REP obtained by converting the pulse signal LP into an electrical signal should have the pulse width Pw and the period of (2×Pw). However, actually, the pulse signal LP is likely to be subjected to some change while it is passing through the transmission line TL, and the pulse width thereof is likely to be decreased. Therefore, the pulse width of the pulse signal REP becomes smaller than Pw in some cases.

According to the second preferred embodiment, since the pulse signal REP can be shaped by the pulse shaping circuits 170a through 170h, the pulse signal REP having the pulse width Pw that the pulse signal REP should have can be obtained even if the pulse width of the pulse signal LP changes while the pulse signal LP is passing through the transmission line TL.

The pulse signal REP output from the light receiving part 161 is input to the pulse shaping circuit 170a as it is, and also is delayed by (2×Pw) in the delay circuit 170i, to be input to the pulse shaping circuit 170b. Then, after the delayed pulse signal REP is input to the pulse shaping circuit 170b, the delayed pulse signal REP is further delayed by (2×Pw) in the delay circuit 170j, to be input to the pulse shaping circuit 170c.

As described above, the period of the pulse signal REP is (2×Pw), which is equal to a delay time given in each of the delay circuits 170i through 170o. Accordingly, in a case where each of all the plurality of pulse signals LP which are generated in the transmitting device 150 with a period of (2×Pw) is input to the receiving device 160 without vanishing on the transmission line TL, at the same time when one of the pulse signals REP which is firstly input to the serial-parallel converter 170 is output from the pulse shaping circuit 170b, another of the pulse signals REP which is secondly input to the serial-parallel converter 170 is output from the pulse shaping circuit 170a. Then, at the same time when the first pulse signal REP is output from the pulse shaping circuit 170c after passing through the delay circuit 170j, the second pulse signal REP is output from the pulse shaping circuit 170b and further, the third pulse signal REP is output from the pulse shaping circuit 170a. Thereafter, in the same manner as described above, when the first pulse signal REP is output from the pulse shaping circuit 170h, the pulse signals REP which are input to the serial-parallel converter 170 from the time of input of the first pulse signal REP to the pulse shaping circuit 170a to the time of input of the first pulse signal REP to the pulse shaping circuit 170h are simultaneously output from the pulse shaping circuits 170a through 170g, respectively. Respective output signals of the pulse shaping circuits 170a through 170h are input as signals SA through SH to the regeneration determiner 171, respectively.

The serial-parallel converter 170 according to the second preferred embodiment operates such that, when input of a certain pulse signal REP is detected in the pulse shaping circuit 170a, the pulse signals REP (including the certain pulse signal REP) which are serially input in a predetermined time period from the time of the detection of the certain pulse signal REP are output in parallel. Since the seven delay circuits 170i through 170o are provided and a delay time given in each of the delay circuits is set to (2×Pw) in the second preferred embodiment, the serial-parallel converter 170 outputs in parallel the pulse signals REP (including the certain pulse signal REP) which are serially input in a time period of (7×2×Pw) from the time of detection of input of the certain pulse signal REP.

In the transmitting device 150, the short pulse signal EPS is converted into three pulse signals LP each having a period of (2×Pw) as described above. Accordingly, in a case where the three pulse signals LP are serially input to the receiving device 160, at the same time when the pulse signal REP which is related to the leading one out of the three pulse signals LP is output from the pulse shaping circuit 170h of the serial-parallel converter 170, the other two pulse signals REP are output from the pulse shaping circuits 170f and 170g, respectively.

On the other hand, in the transmitting device 150, the long pulse signal EPL is converted into seven pulse signals LP each having a period of (2×Pw). Accordingly, in a case where the seven pulse signals are serially input to the receiving device 160, at the same time when the pulse signal REP which is related to the leading one out of the seven pulse signals LP is output from the pulse shaping circuit 170h, the other six pulse signals REP are output from the pulse shaping circuits 170b through 170g, respectively.

Next, the regeneration determiner 171 will be described in detail. FIG. 25 is a view for showing a structure of the regeneration determiner 171. As shown in FIG. 25, the regeneration determiner 171 includes AND circuits 171a through 171m, OR circuits 171n through 171s, and delay circuits 171t through 171w. The AND circuit 171a calculates and outputs AND of the signals SA and SB, the AND circuit 171b calculates and outputs AND of the signals SA and SC, and the AND circuit 171c calculates and outputs AND of the signals SB and SC. The AND circuit 171d calculates and outputs AND of the signals SA and SD, the AND circuit 171e calculates and outputs AND of the signals SB and SD, and the AND circuit 171f calculates and outputs AND of the signals SC and SD.

The AND circuit 171g calculates and outputs AND of the signals SE and SF, the AND circuit 171h calculates and outputs AND of the signals SE and SG, and the AND circuit 171i calculates and outputs AND of the signals SF and SG. The AND circuit 171j calculates and outputs AND of the signals SE and SH, the AND circuit 171k calculates and outputs AND of the signals SF and SH, and the AND circuit 171l calculates and outputs AND of the signals SG and SH.

The OR circuit 171n calculates and outputs OR of output signals of the AND circuits 171b and 171c, and the OR circuit 1710 calculates and outputs OR of output signals of the AND circuits 171d, 171e, and 171f. The OR circuit 171p calculates and outputs OR of output signals of the AND circuits 171h and 171i, and the OR circuit 171q calculates and outputs OR of output signals of the AND circuits 171j, 171k, and 171l.

The delay circuit 171t outputs an output signal of the AND circuit 171a which is delayed by (4×Pw), and the delay circuit 171u outputs an output signal of the OR circuit 171n which is delayed by (2×Pw). The delay circuit 171v outputs an output signal of the AND circuit 171g which is delayed by (4×Pw), ant the delay circuit 171w outputs an output signal of the OR circuit 171p which is delayed by (2×Pw).

The OR circuit 171r calculates and outputs OR of an output signal ST of the delay circuit 171t, an output signal SU of the delay circuit 171u, and an output signal SO of the OR circuit 171o, and the OR circuit 171s calculates and outputs OR of an output signal SV of the delay circuit 171v, an output signal SW of the delay circuit 171w, and an output signal SQ of the OR circuit 171q. Then, the AND circuit 171m calculates and outputs AND of an output signal SR of the OR circuit 171r and an output signal JS1 of the OR circuit 171s. An output signal JS0 of the AND circuit 171m and the output signal JS1 of the OR circuit 171s are input to the regenerated pulse supplier 172.

In the regeneration determiner 171 configured as described above, when the pulse signals REP are simultaneously output from at least two of the pulse shaping circuits 170a through 170d, in other words, when at least two of the signals SA through SD simultaneously enter to "High" level, an output of the OR circuit 171r enters to "High" level. Also, when the pulse signals REP are simultaneously output from at least two of the pulse shaping circuits 170e through 170h, in other words, when at least two of the signals SE through SH simultaneously enter to "High" level, an output of the OR circuit 171s enters to "High" level. Then, as the respective outputs of the OR circuits 171r and 171s simultaneously enter to "High" level, an output of the AND circuit 171m enters to "High" level.

According to the second preferred embodiment, each of the output signal JS0 of the AND circuit 171m and the output signal JS1 of the OR circuit 171s functions as a signal which indicates whether or not the long pulse signal EPL and the short pulse signal EPS should be regenerated. Specifically, when the regeneration determiner 171 determines that the long pulse signal EPL should be regenerated, both the output signals JS0 and JS1 are set at "High" level. On the other hand, when the regeneration determiner 171 determines that the short pulse signal EPS should be regenerated, the output signal JS0 is set at "Low" level and the output signal JS1 is set at "High" level. As such, in the regenerated pulse supplier 172, when both the output signals JS0 and JS1 enter to "High" level, the long pulse signal EPL is regenerated, and when only the output signal JS1 enters to "High" level, the short pulse signal EPS is regenerated.

FIG. 26 is a view for showing a structure of the regenerated pulse supplier 172. As shown in FIG. 26, the regenerated pulse supplier 172 includes one-shot pulse generating circuits 172a and 172b and an OR circuit 172c. The one-shot pulse generating circuit 172a outputs a pulse signal REPL which indicates "High" level during a time period of (14×Pw) from the time when the output signal JS0 enters to "High" level. In other words, the one-shot pulse generating circuit 172a outputs the pulse signal REPL having a pulse width of (14×Pw) in accordance with a rise time of the output signal JS0. The one-shot pulse generating circuit 172b outputs a pulse signal REPS which indicates "High" level during a time period of (7×Pw) in accordance with the time when the output signal JS1 enters to "High" level. In other words, the one-shot pulse generating circuit 172b outputs the pulse signal REPS having a pulse width of (7×Pw) depending on a rise time of the output signal JS1. The OR circuit 172c calculates OR of respective output signals of the one-shot pulse generating circuits 172a and 172b, and outputs the OR as a signal SZ. It is additionally noted that in each of the one-shot pulse generating circuits 172a and 172b, even if a new input signal rises while a given pulse signal is being output, such rise of the new input signal is disregarded so that no pulse signal is generated based thereon.

In the regenerated pulse supplier 172 configured as described above, when the output signals JS0 and JS1 simultaneously enter to "High" level, the pulse signal REPL having a large pulse width is output as a regenerated signal of the long pulse signal EPL from the OR circuit 172c. On the other hand, when only the output signal JS1 enters to "High" level, the pulse signal REPS having a small pulse width is output as a regenerated signal of the short pulse signal EPS from the OR circuit 172c. The pulse signal REPL and the pulse signal REPS will be hereinafter referred to as a "regenerated long pulse signal REPL" and a "regenerated short pulse signal REPS".

The short pulse signal EPS is converted into three pulse signals LP in the transmitting device 150 as described above. After at least two of the three pulse signals LP are serially input to the receiving device 160 and the pulse signal REP which is related to the leading pulse signal LP of the at least two is output from the pulse shaping circuit 170h, the output signal JS0 enters to "Low" level and the output signal JS1 enters to "High" level in the regeneration determiner 171. In other words, the regeneration determiner 171 determines that the short pulse signal EPS should be regenerated when the number of the pulse signals REP arising from the short pulse signal EPS, which are output in parallel from the serial-parallel converter 170, is equal to or larger than two.

Figure 27:
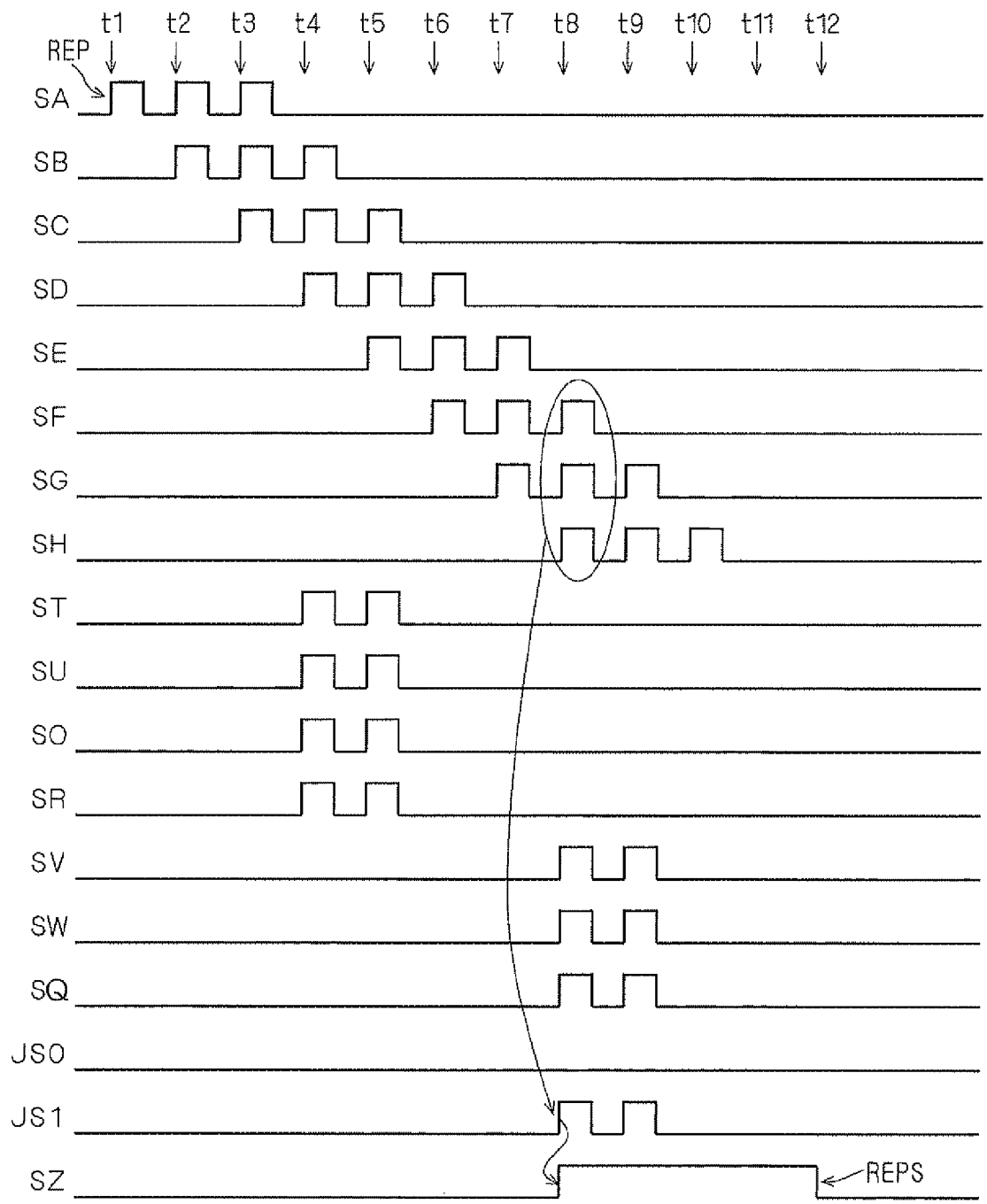
FIG. 27 is a view for showing operations of the pulse regenerating part according to the second preferred embodiment of the present invention.
Figure 28:
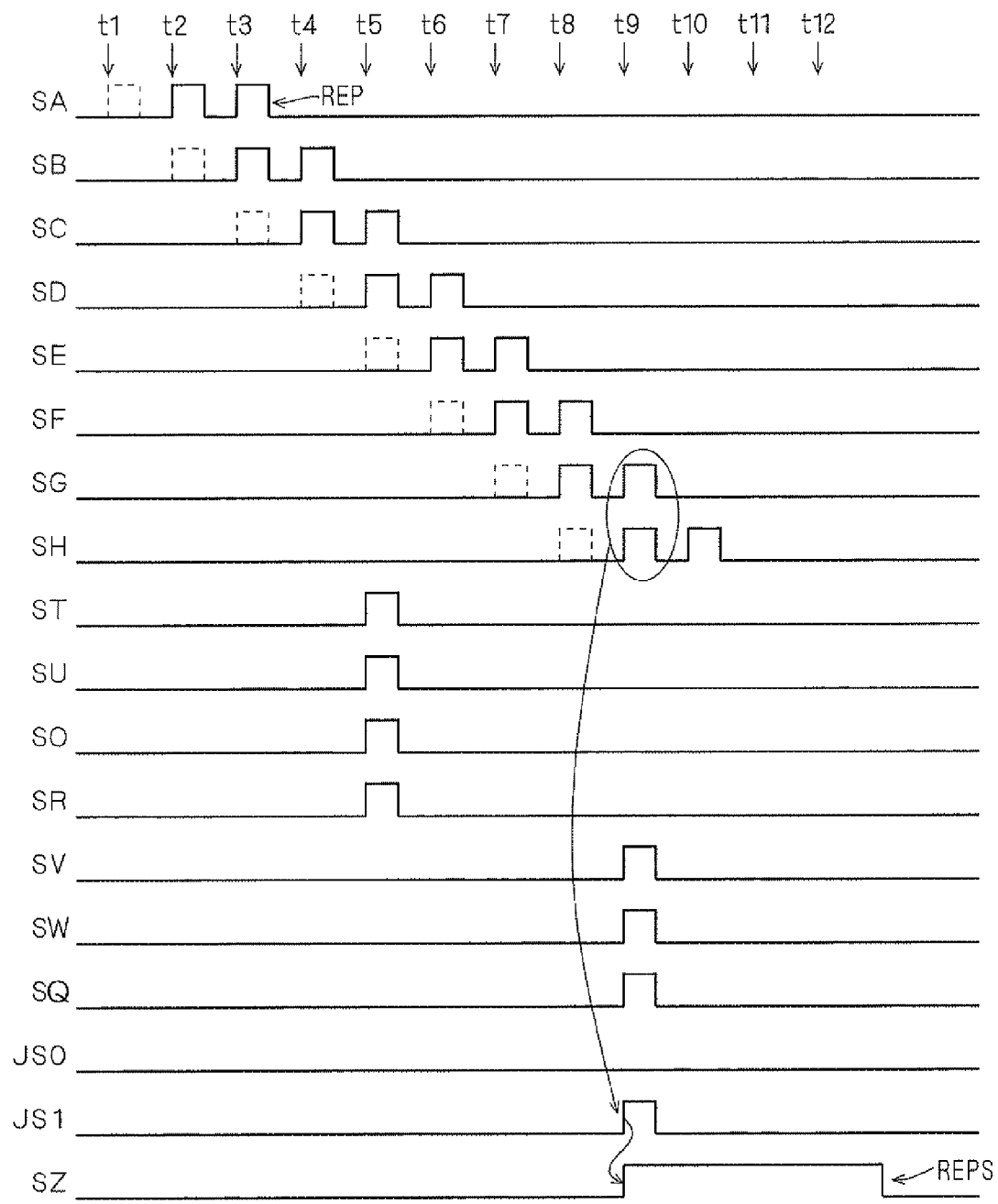
FIG. 28 is a view for showing operations of the pulse regenerating part according to the second preferred embodiment of the present invention.
Figure 29:
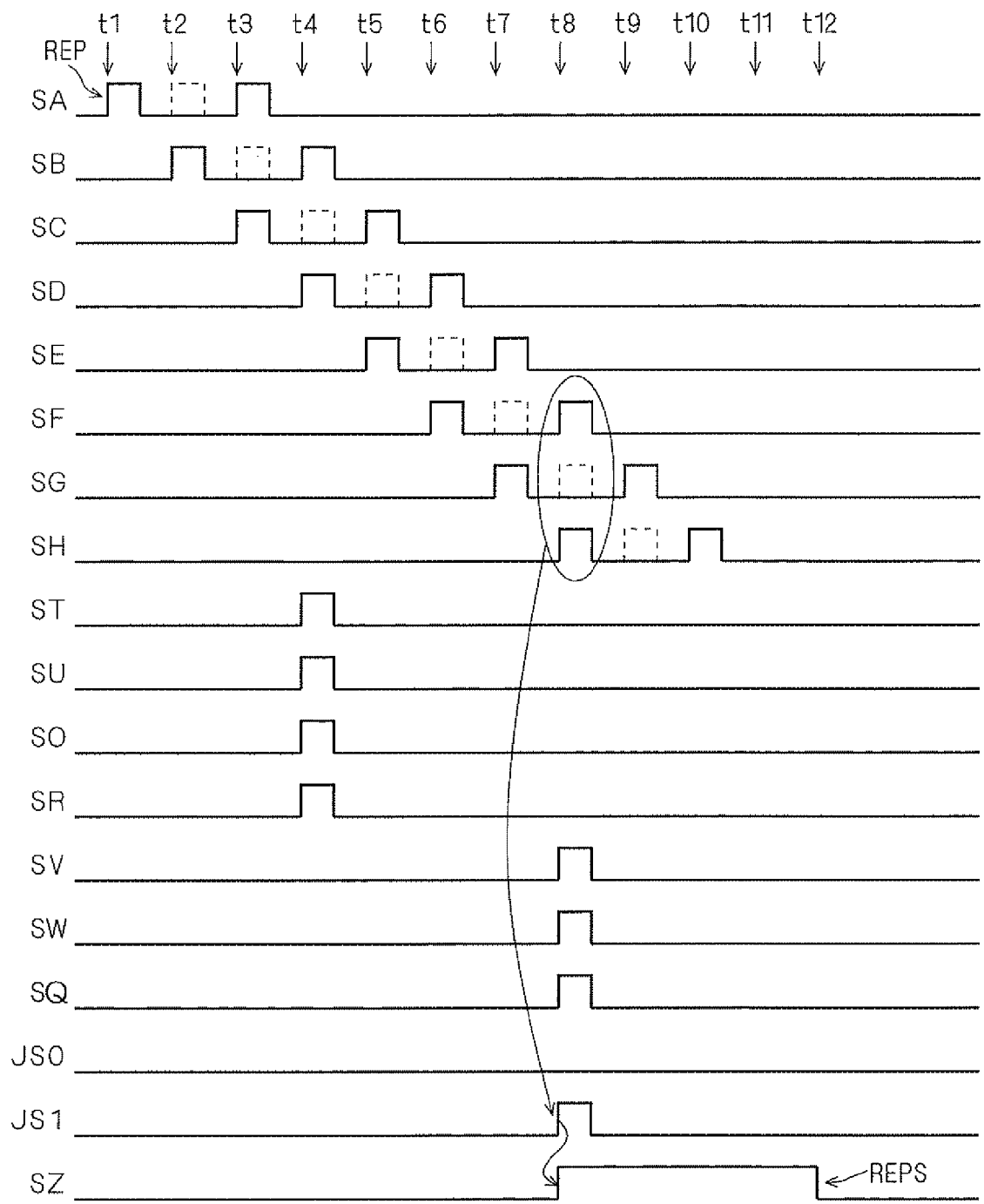
FIG. 29 is a view for showing operations of the pulse regenerating part according to the second preferred embodiment of the present invention.
Figure 30:
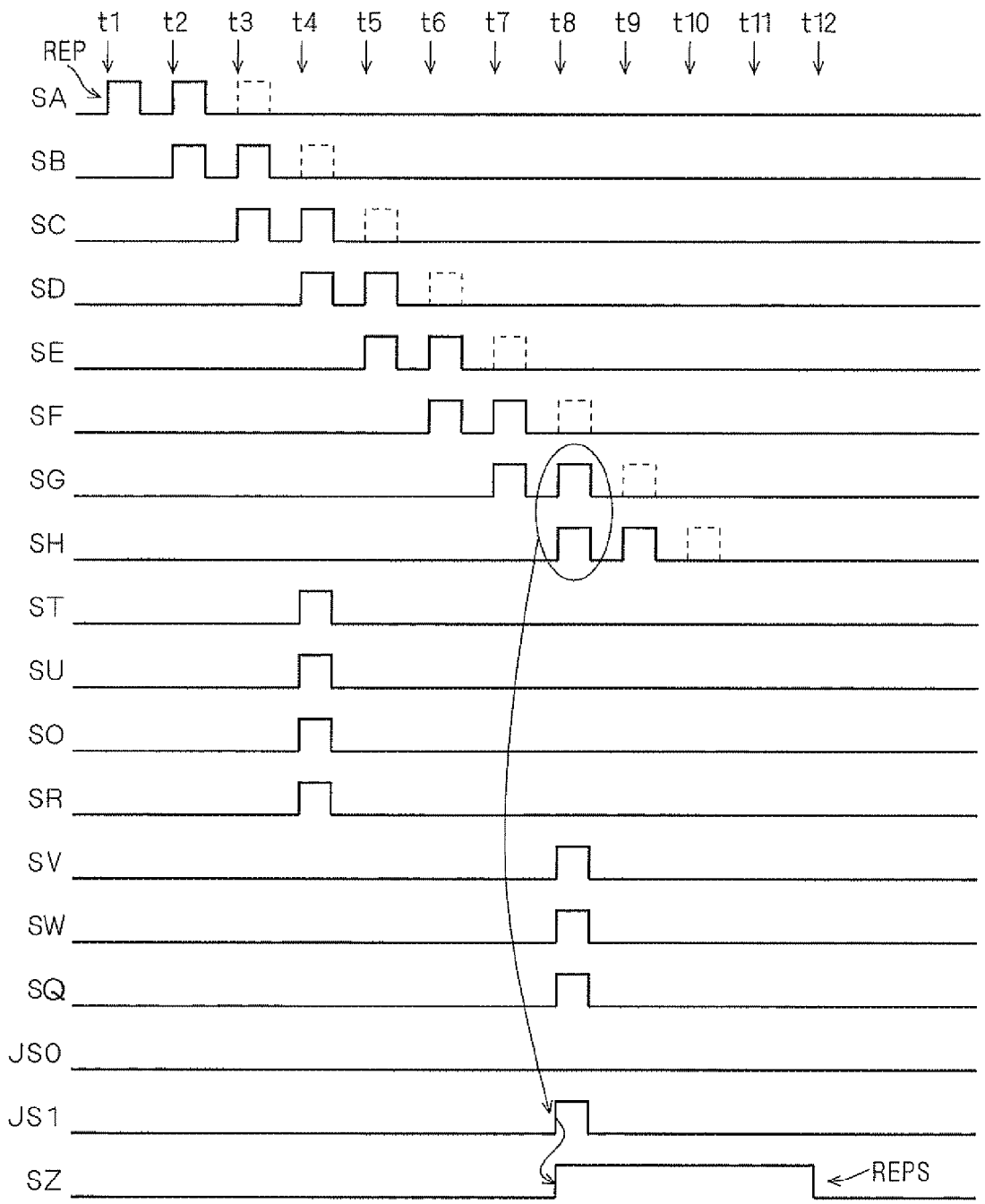
FIG. 30 is a view for showing operations of the pulse regenerating part according to the second preferred embodiment of the present invention.

FIGS. 27 through 30 are views for showing operations of the pulse regenerating part 162 in regenerating the short pulse signal EPS. FIG. 27 shows operations performed in a case where all of the three pulse signals LP into which the short pulse signal EPS is converted are serially input to the receiving device 160, FIG. 28 shows operations performed in a case where the leading pulse signal LP of the three pulse signals LP vanishes, FIG. 29 shows operations in a case where the second pulse signal LP of the three pulse signals LP vanishes, and FIG. 30 shows operations performed in a case where the last pulse signal LP of the three pulse signals LP vanishes.

In examples shown in FIGS. 27, 29, and 30, the plurality of pulse signals REP arising from the short pulse signal EPS, which are serially input to the serial-parallel converter 170 from a time t1 to a time t8, are output in parallel from the serial-parallel converter 170 at a time t8. Then, the output signal JS0 enters to "Low" level and the output signal JS1 enters to "High" level at a time t8, and the regenerated short pulse signal REPS is output from the regenerated pulse supplier 172.

On the other hand, in the case where the leading pulse signal LP vanishes as shown in FIG. 28, the plurality of pulse signals REP arising from the short pulse signal EPS, which are serially input to the serial-parallel converter 170 from a time t2 to a time t9, are output in parallel from the serial-parallel converter 170 at a time t9. Then, at a time t9 which is (2×Pw) behind the corresponding time in the examples of FIGS. 27, 29, and 30, the output signal JS0 enters to "Low" level and the output signal JS1 enters to "High" level, and the regenerated short pulse signal REPS is output from the regenerated pulse supplier 172. This is because the time of the first input of the pulse signal REP into the serial-parallel converter 170 is delayed by (2×Pw) due to vanishment of the leading pulse signal LP.

The long pulse signal EPL is regenerated on different conditions from those for the short pulse signal EPS. Specifically, when at least two out of the first four pulse signals LP in the seven pulse signals LP into which the long pulse signal EPL is converted are input to the receiving device 160 and at least two out of the remaining three pulse signals LP are input to the receiving device 160, the long pulse signal EPL is regenerated basically. However, even under the foregoing conditions, unless the output signals of the OR circuits 171r and 171s of the regeneration determiner 171 simultaneously enter to "High" level, the long pulse signal EPL is not regenerated.

For example, in a case where the second pulse signal LP and the fifth pulse signal LP out of the seven pulse signals LP arising from the long pulse signal EPL vanish, the output signals of the OR circuits 171r and 171s do not simultaneously enter to "High" level, so that the long pulse signal EPL is not regenerated. Also, in a case where the leading pulse signal LP and the seventh pulse signal LP out of the seven pulse signals LP vanish, the output signals of the OR circuits 171r and 171s do not simultaneously enter to "High" level, so that the long pulse signal EPL is not regenerated. Further, in a case where the leading and second pulse signals LP vanish, the output signals of the OR circuits 171r and 171s do not simultaneously enter to "High" level regardless of the presence or absence of the fifth, sixth, and seventh pulse signals LP, so that the long pulse signal EPL is not regenerated.

As described above, according to the second preferred embodiment, the long pulse signal EPL is regenerated on conditions which are greatly different from those under which the short pulse signal EPS is regenerated. This is because the same circuit that is required for regenerating the short pulse signal EPS is used for regenerating the long pulse signal EPL. As shown in FIG. 25, in the second preferred embodiment, a circuit required for regenerating the short pulse signal EPS, which includes the AND circuits 171g through 171l, the OR circuits 171p, 171q, and 171s, and the delay circuits 171v and 171w, has the same circuit configuration as a circuit required for regenerating the long pulse signal EPL, which includes the AND circuits 171a through 171f, the OR circuits 171n, 171o, and 171r, and the delay circuits 171t and 171u. As such, without regard for advantages in a circuit configuration, the pulse regenerating part 162 may alternatively be configured such that the long pulse signal EPL is surely regenerated when the number of the pulse signals REP arising from the long pulse signal EPL which are output in parallel from the serial-parallel converter 170 is larger than a predetermined number (four, for example), in the same manner as in regenerating the short pulse signal EPS.

Figure 31:
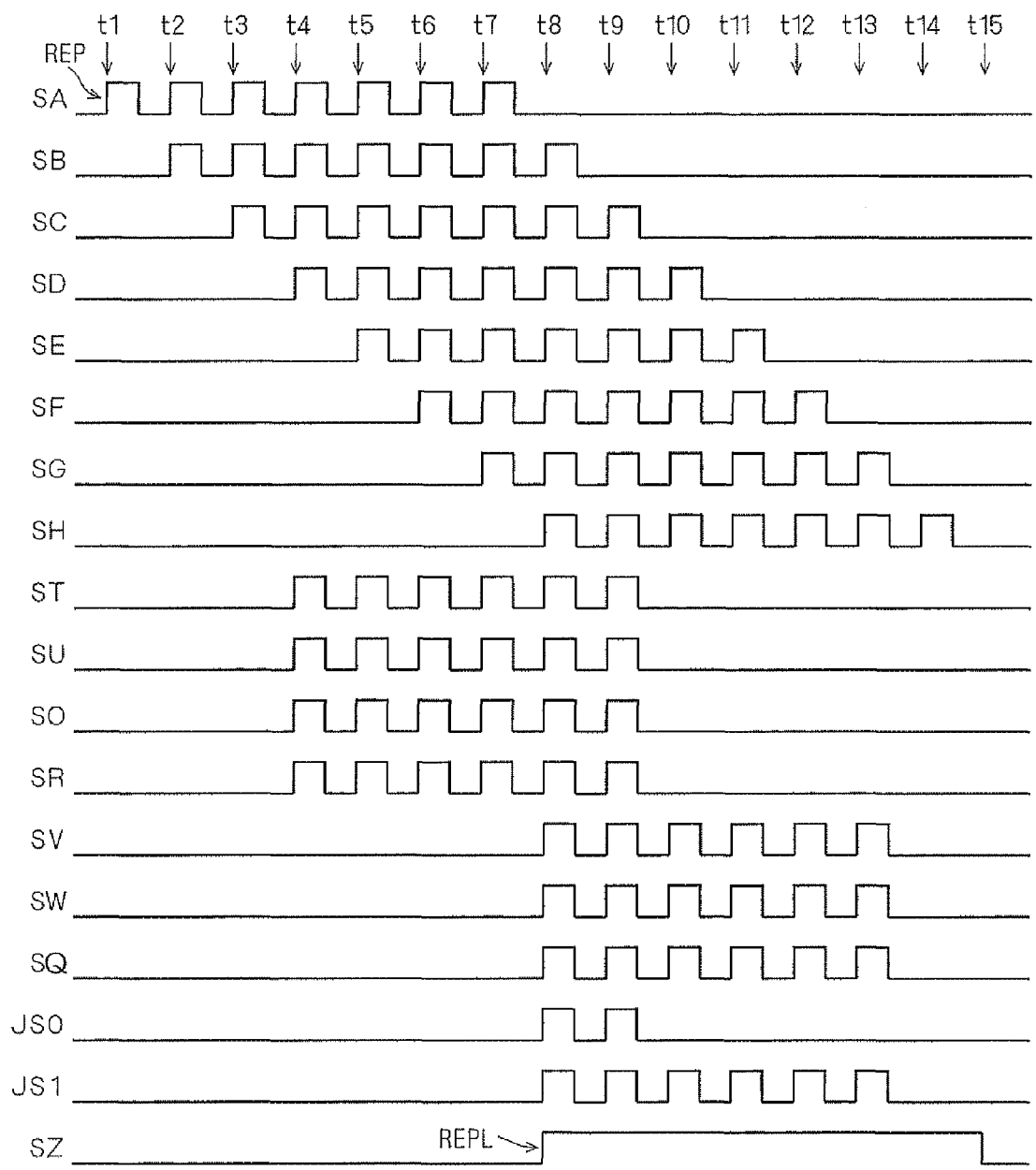
FIG. 31 is a view for showing operations of the pulse regenerating part according to the second preferred embodiment of the present invention.

FIG. 31 shows operations of the pulse regenerating part 162 in regenerating the long pulse signal EPL. FIG. 31 shows operations of the pulse regenerating part 162 in a case where all the seven pulse signals LP arising from the long pulse signal EPL are input to the receiving device 160. As shown in FIG. 31, the seven pulse signals REP which are serially input to the serial-parallel converter 170 from a time t1 to a time t8 are output in parallel from the serial-parallel converter 170 at a time t8. Then, both the output signals JS0 and JS1 enter to "High" level at a time t8, and the regenerated long pulse signal REPL is output from the regenerated pulse supplier 172.

As described above, according to the second preferred embodiment, whether or not the short pulse signal EPS should be regenerated is determined based on the number of the pulse signals REP arising from the short pulse signal EPS, which are output in parallel from the serial-parallel converter 170. As such, it is possible to make a determination as to regeneration of the short pulse signal EPS at the point in time when the pulse signals REP arising from the short pulse signal EPS, which are serially input to the serial-parallel converter 170, are output in parallel from the serial-parallel converter 170 (i.e., a time t8 in the examples in FIGS. 27, 29, and 30, and a time t9 in the example in FIG. 28). Therefore, possible errors in timing for regeneration of the short pulse signal EPS can be reduced in the second preferred embodiment. This suppresses omission, double reading, or the like of received data, to thereby correctly decode the regenerated coded data RCDD.

In the examples shown in FIGS. 27, 29, and 30 in each of which the leading pulse signal REP is present, the short pulse signals EPS are regenerated at the same point in time. Even if the leading pulse signal LP vanishes, the short pulse signal EPS can be regenerated with only short delay which is as short as (2×Pw). The delay time of (2×Pw), which is shorter than the pulse width EPWS (=4×2×Pw) of the short pulse signal EPS, is insignificant in regenerating the informational data IFD in the data decoding part 163.

Further, according to the second preferred embodiment, whether or not the short pulse signal EPS should be regenerated is determined based on the number of the pulse signals REP. As such, even if an unnecessary pulse signal LP is caused on the transmission line TL, it is possible to prevent erroneous regeneration of the short pulse signal EPS. Also, even if the pulse signals LP having different pulse widths are input to the receiving device 160, the short pulse signal EPS can be regenerated. Moreover, even if some of the plurality of pulse signals LP which are generated on the side of the transmitting device 150 vanish on the transmission line TL, the short pulse signal EPS can be surely regenerated.

Furthermore, according to the second preferred embodiment, the pulse signals REP are output from the serial-parallel converter 170 after being shaped. As such, even if the pulse width of the pulse signal LP changes on the transmission line TL, the regeneration determiner 171 can exactly determine the number of the pulse signals REP. Thus, erroneous regeneration of the short pulse signal EPS can be suppressed.

Additionally, though each of the short pulse signal EPS and the long pulse signal EPL is converted into a plurality of optical pulse signals in the transmitting device 150 according to the second preferred embodiment, each of the pulse signals may alternatively be converted into a plurality of electrical pulse signals. In this alternative case, the light receiving part 161 for converting an optical signal into an electrical signal in the receiving device 160 is unnecessary.

Also, though two kinds of pulse signals of the short pulse signal EPS and the long pulse signal EPL are regenerated in the second preferred embodiment, if only one kind of pulse signal which is generated at a transmitting end is required to be regenerated at a receiving end, the structure of the pulse regenerating part 162 can be simplified. For example, if only the short pulse signal EPS is required to be regenerated, the pulse shaping circuits 170a through 170d and the delay circuits 170i through 170l in the serial-parallel converter 170, the AND circuits 171a through 171f and 171m, the OR circuits 171n, 171o, and 171r, and the delay circuits 171t and 171u in the regeneration determiner 171, and the one-shot pulse generating circuit 172a and the OR circuit 172c in the regenerated pulse supplier 172 are unnecessary.

<Modification of Pulse Regenerating Part>

Figure 32:
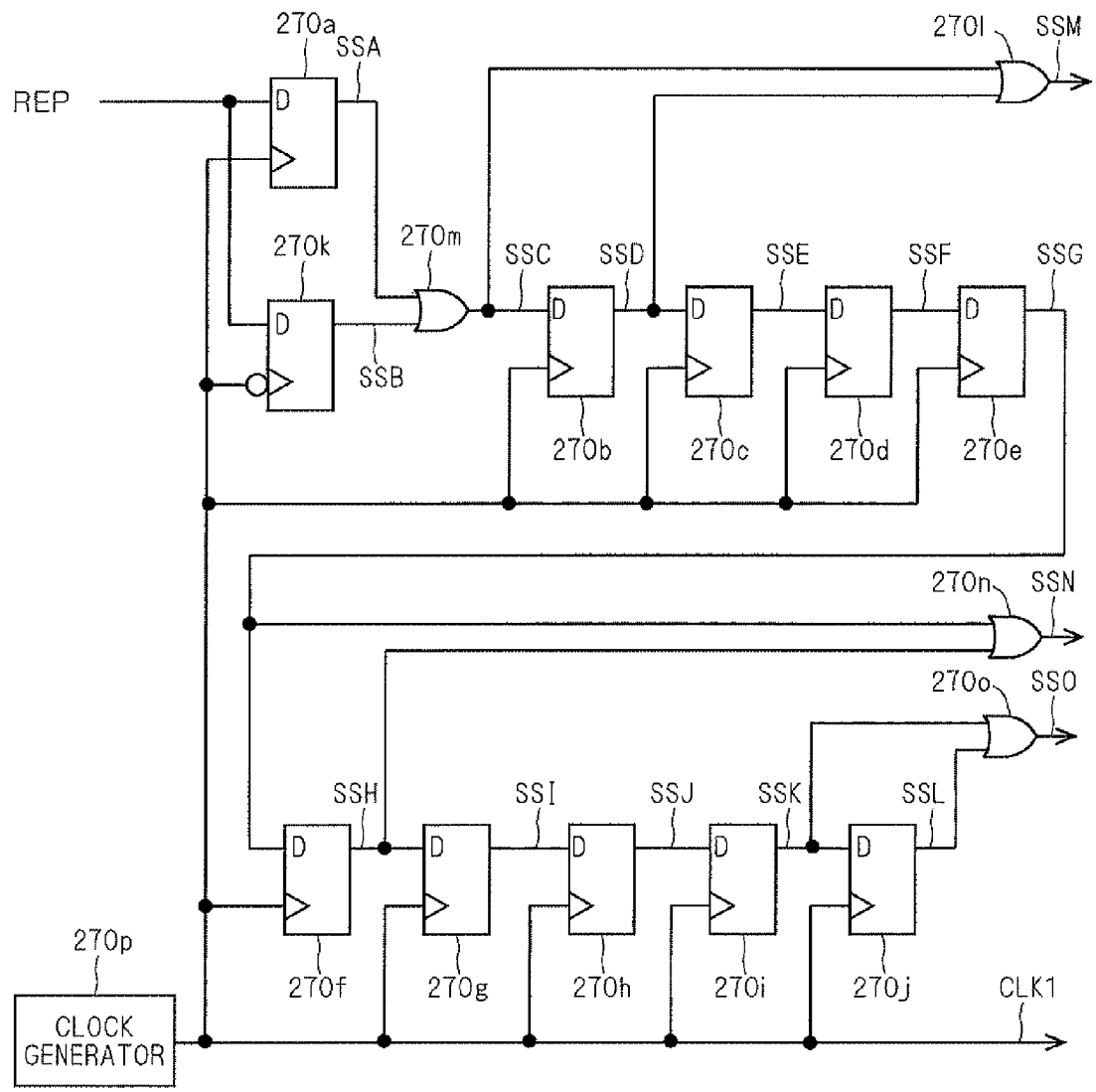
FIG. 32 is a view for showing a structure of a modification of the serial-parallel converter according to the second preferred embodiment of the present invention.
Figure 33:
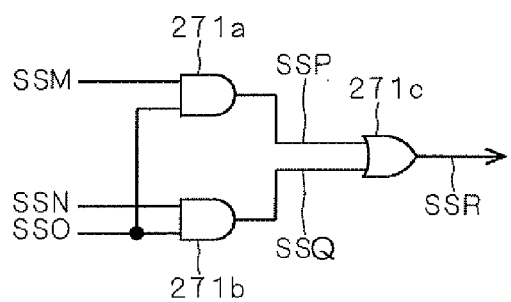
FIG. 33 is a view for showing a structure of a modification of the regeneration determiner according to the second preferred embodiment of the present invention.
Figure 34:
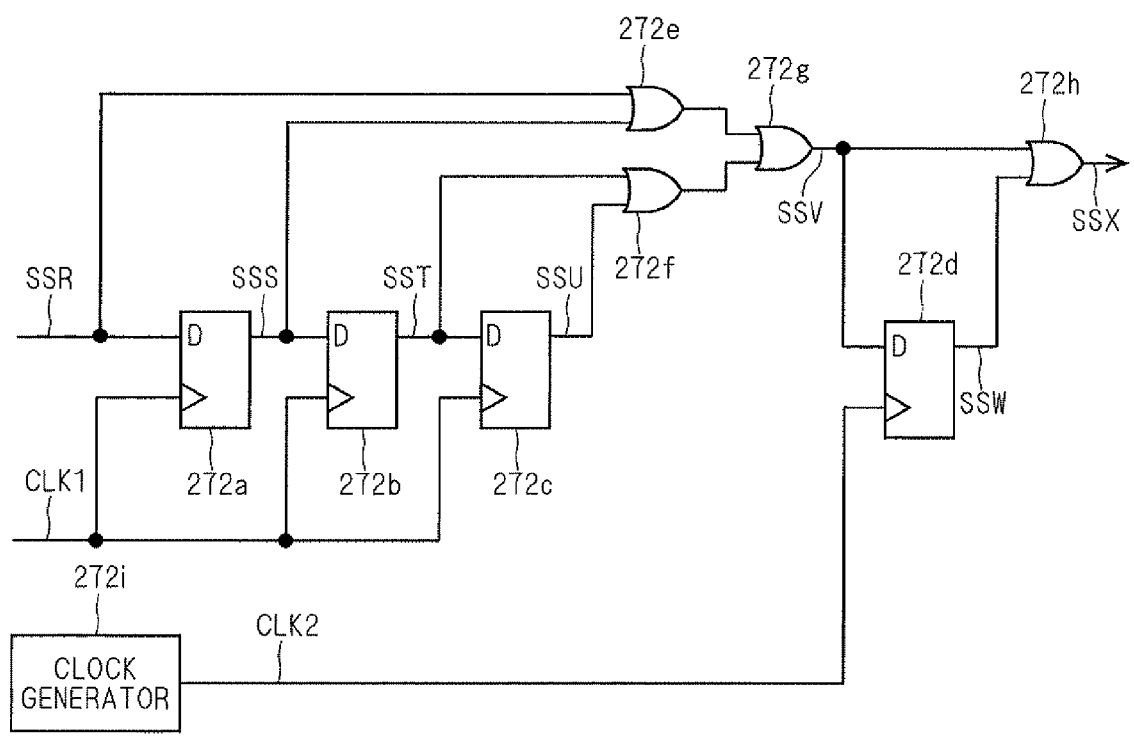
FIG. 34 is a view for showing a structure of a modification of the regenerated pulse supplier according to the second preferred embodiment of the present invention.

Next, another example of a structure of the pulse regenerating part 162 will be described. FIGS. 32, 33, and 34 are views for showing modifications of the serial-parallel converter 170, the regeneration determiner 171, and the regenerated pulse supplier 172, respectively. In the following description, the respective modifications of the serial-parallel converter 170, the regeneration determiner 171, and the regenerated pulse supplier 172 will be referred to as a "serial-parallel converting circuit 270", a "regeneration determiner 271", and a "regenerated pulse supplier 272", respectively.

As shown in FIG. 32, the serial-parallel converting circuit 270 includes flip-flops circuits 270a through 270k, OR circuits 270l through 270o, and a clock generator 270p. A duty ratio of a clock signal CLK1 output from the clock generator 270p is set to 50%, and a period of the same is set to a half of Pw. Accordingly, if Pw is equal to 400 ns, the period of the clock signal CLK1 is 200 ns.

Each of the flip-flop circuits 270a through 270j holds and outputs a signal input to a data input terminal D thereof at a rising edge of the clock signal CLK1. On the other hand, the flip-flop circuit 270k holds and outputs a signal input to a data input terminal D thereof at a falling edge of the clock signal CLK1. The pulse signal REP is input to the data input terminal D of each of the flip-flop circuits 270a and 270k. The OR circuit 270m calculates and outputs OR of output signals of the flip-flop circuits 270a and 270k, and an output signal of the OR circuit 270m is input to the data input terminal D of the flip-flop circuit 270b. The flip-flop circuits 270b through 270j are serially connected in the order noted, and each of the flip-flop circuits 270b through 270j holds and outputs an output signal fed from a preceding stage at a rising edge of the clock signal CLK1. The OR circuit 270l calculates and outputs OR of an output signal of the OR circuit 270m and an output signal of the flip-flop circuit 270b. The OR circuit 270n calculates and outputs OR of output signals of the flip-flop circuits 270e and 270f. The OR circuit 270o calculates and outputs OR of output signals of the flip-flop circuits 270i and 270j.

It is noted that the respective output signals of the flip-flop circuits 270a and 270k will be referred to as a "signal SSA" and a "signal SSB", and the output signal of the OR circuit 270m will be referred to as a "signal SSC". Also, the respective output signals of the flip-flop circuits 270b through 270j will be referred to as "signals SSD through SSL", respectively. Further, the respective output signals of the OR circuits 270l, 270n, and 270o will be referred to as "signals SSM, SSN, and SSO", respectively.

The regeneration determiner 271 includes AND circuits 271a and 271b and an OR circuit 271c as shown in FIG. 33. The AND circuit 271a calculates AND of the signal SSM and the signal SSO, and outputs the result as a signal SSP. The AND circuit 271b calculates AND of the signal SSN and the signal SSO, and outputs the result as a signal SSQ. Then, the OR circuit 271c calculates OR of the signal SSP and the signal SSQ, and outputs the result as a signal SSR.

The regenerated pulse supplier 272 includes flip-flop circuits 272a through 272d, OR circuits 272e through 272f, and a clock generator 272i, as shown in FIG. 34. A duty ratio of a clock signal CLK2 output from the clock generator 272i is set to 50%, and a period of the same is set to be twice as long as Pw. Accordingly, if Pw is equal to 400 ns, the period of the clock signal CLK2 is 800 ns. Thus, the frequency of the clock signal CLK2 is equal to a quarter of the frequency of the clock signal CLK1.

Each of the flip-flop circuits 272a, 272b, and 272c holds and outputs a signal input to a data input terminal D thereof at a rising edge of the clock signal CLK1. On the other hand, the flip-flop circuit 272d holds and outputs a signal input to a data input terminal D thereof at a rising edge of the clock signal CLK2. The signal SSR is input to the data input terminal D of the flip-flop circuit 272a. The flip-flop circuits 272a, 272b, and 272c are serially connected in the order noted, and each of the flip-flop circuits 272a, 272b, and 272c holds and outputs an output signal fed from a preceding stage at a rising edge of the clock signal CLK1.

The OR circuit 272e calculates and outputs OR of the signal SSR and a signal SSS which is the output signal of the flip-flop circuit 272a, and the OR circuit 272f calculates and outputs OR of a signal SST which is the output signal of the flip-flop circuit 272b and a signal SSU which is the output signal of the flip-flop circuit 272c. Then, the OR circuit 272g calculates OR of the respective output signals of the OR circuits 272e and 272f, and outputs the result as a signal SSV.

The signal SSV is input to a data input terminal D of the flip-flop circuit 272d. The OR circuit 272h calculates OR of the signal SSV and a signal SSW which is the output signal of the flip-flop circuit 272d, and outputs the result as a signal SSX.

Figure 35:
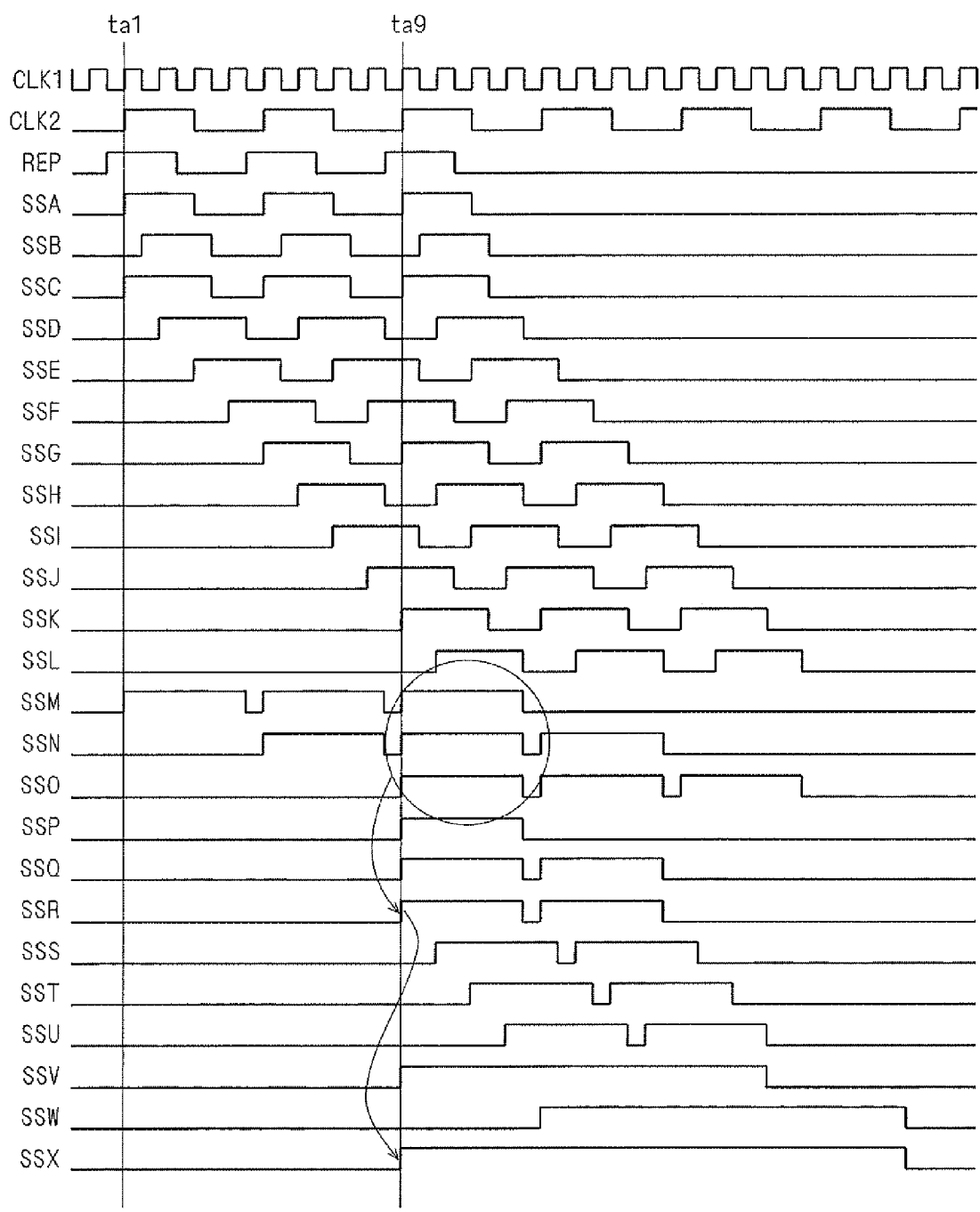
FIG. 35 is a view for showing operations of the modification of the pulse regenerating part according to the second preferred embodiment of the present invention.
Figure 36:
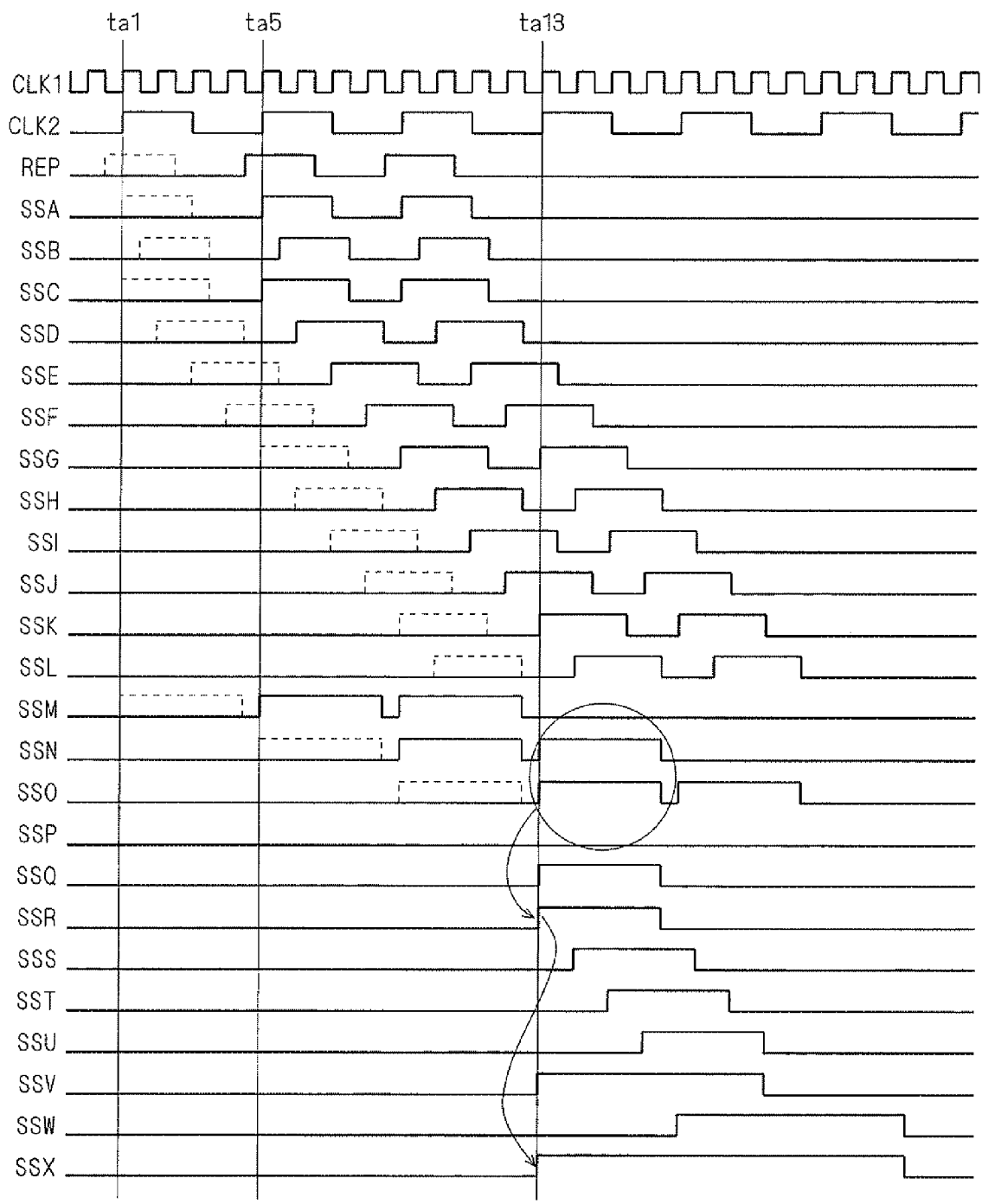
FIG. 36 is a view for showing operations of the modification of the pulse regenerating part according to the second preferred embodiment of the present invention.
Figure 37:
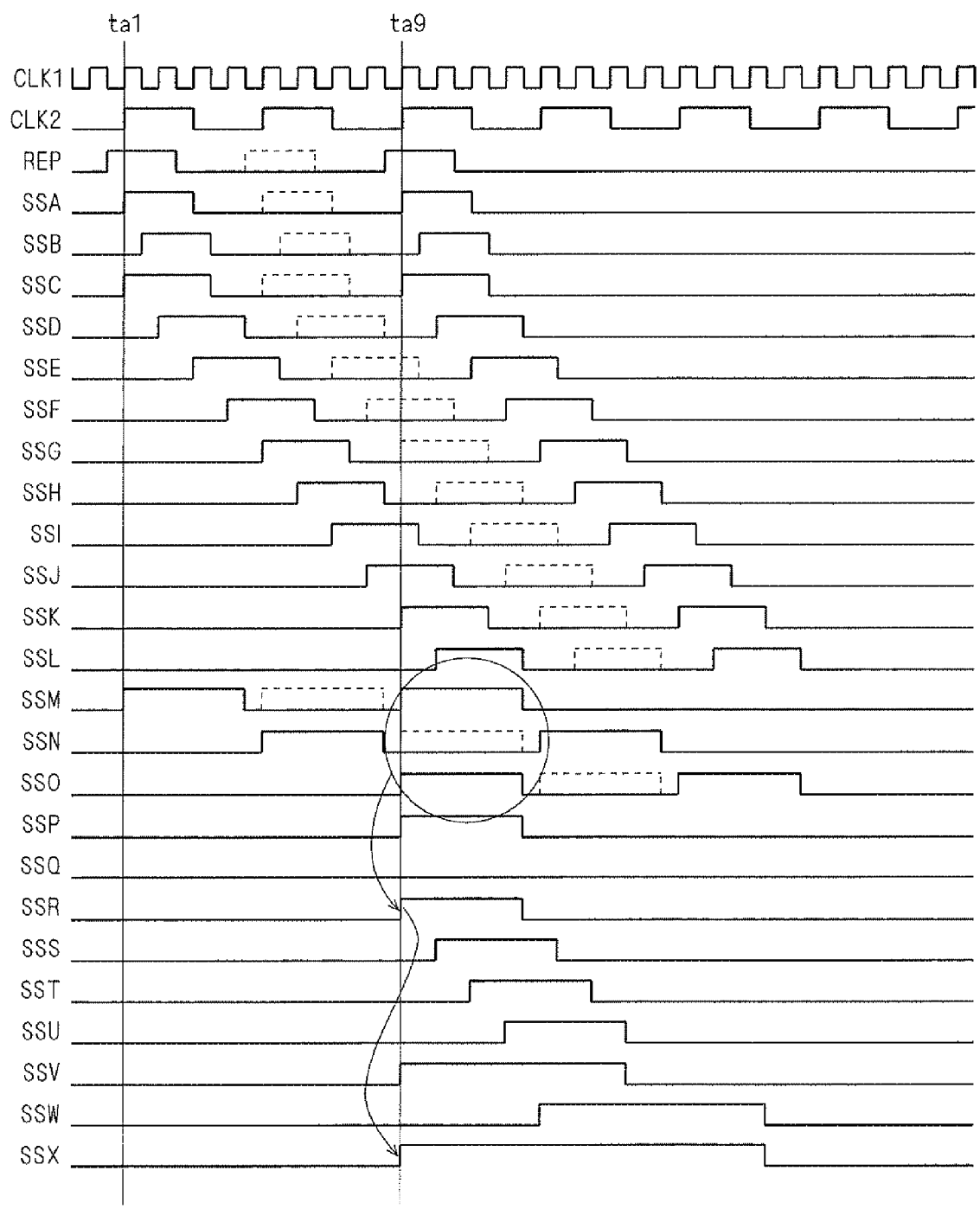
FIG. 37 is a view for showing operations of the modification of the pulse regenerating part according to the second preferred embodiment of the present invention.
Figure 38:
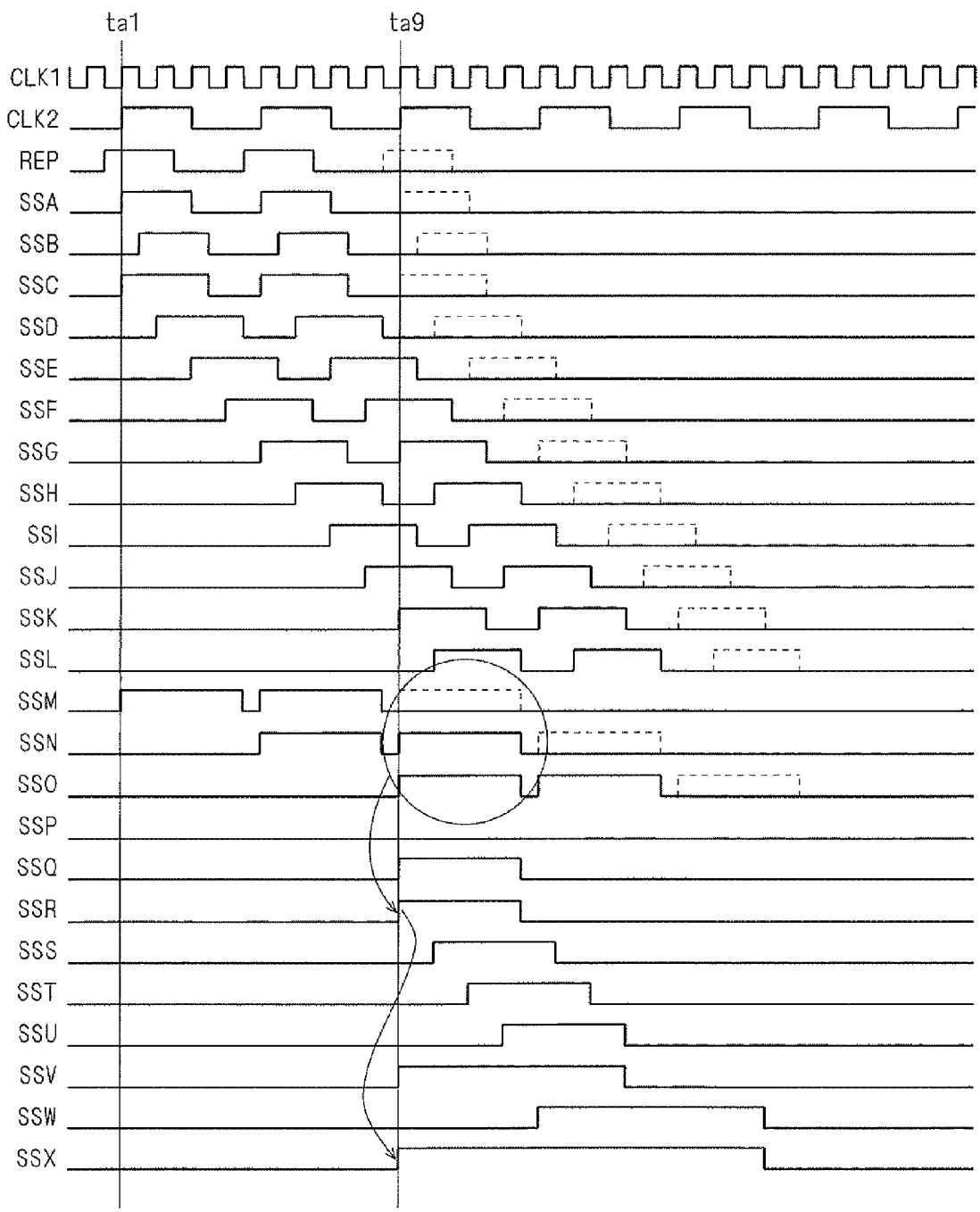
FIG. 38 is a view for showing operations of the modification of the pulse regenerating part according to the second preferred embodiment of the present invention.

Next, operations of the modification of the pulse regenerating part 162 which are shown in FIGS. 32, 33, and 34 will be described. FIGS. 35, 36, 37, and 38 are views for showing operations of the modification of the pulse regenerating part 162 in regenerating the short pulse signal EPS. FIG. 35 shows operations in a case where all of the three pulse signals LP into which the short pulse signal EPS is converted are serially input to the receiving device 160, FIG. 36 shows operations in a case where the leading pulse signal LP out of the three pulse signals LP vanishes, FIG. 37 shows operations in a case where the second pulse signal LP out of the three pulse signals LP vanishes, and FIG. 38 shows operation in a case where the last pulse signal LP out of the three pulse signals LP vanishes.

The serial-parallel converting circuit 270 shown in FIG. 32 is able to detect input of the pulse signal REP at a rising edge or a falling edge of the clock signal CLK1. When the serial-parallel converting circuit 270 detects input of the pulse signal REP, the serial-parallel converting circuit 270 raises the signal SSC to "High" level for a predetermined time period. Thus, in the serial-parallel converting circuit 270, following detection of input of the pulse signal REP, a pulse signal is output from the OR circuit 270m.

In the examples shown in FIGS. 35, 37, and 38, the first pulse signal REP is input to the serial-parallel converting circuit 270 a little before a time ta1 of given rise of the clock signal CLK1, so that the serial-parallel converting circuit 270 detects input of the first pulse signal REP and raises the signal SSC to "High" level at a time ta1.

On the other hand, in the example shown in FIG. 36, since the leading pulse signal LP out of the three pulse signals LP into which the short pulse signal EPS is converted vanishes, the first pulse signal REP is input to the serial-parallel converting circuit 270 at a time which is (2×Pw) behind a time ta1, in other words, a little before a time ta5. As such, the serial-parallel converting circuit 270 detects input of the first pulse signal REP at a time ta5.

In the serial-parallel converting circuit 270, following detection of input of a given pulse signal REP, the pulse signals REP (including the given pulse signal REP) which are serially input for a time period of (4×Pw) from the time of the detection are output in parallel from the OR circuits 270l, 270n, and 270o. At that time, the pulse signals REP are output after being shaped so as to have a predetermined pulse width. The serial-parallel converting circuit 270 outputs the pulse signals REP each having a pulse width of (7/4×Pw) as shown at the signals SSM, SSN, and SSO in FIGS. 35, 36, 37, and 38.

In the examples shown in FIGS. 35, 37, and 38, the pulse signal REP is first detected at a time ta1, and the pulse signals REP which are serially input for a time period of (4×Pw) from a time ta1, in other words, from a time ta1 to a time ta9, are output in parallel from the OR circuits 270l, 270n, and 270o at a time ta9.

On the other hand, in the example shown in FIG. 36, the pulse signal REP is first detected at a time ta5, and the pulse signals REP which are serially input for a time period of (4×Pw) from a time ta5, in other words, from a time ta5 to a time ta13, are output in parallel from the OR circuits 270l, 270n, and 270o at a time ta13.

In the regeneration determiner 271, when two or more pulse signals REP are output in parallel from the serial-parallel converting circuit 270, that is, when at least two of the signals SSM, SSN, and SSO simultaneously enter to "High" level, it is determined that the short pulse signal EPS should be regenerated and the signal SSR is raised to "High" level. Then, after the signal SSR enters to "High" level, the regenerated pulse supplier 272 generates a pulse signal having a short pulse width, and outputs the generated pulse signal as a regenerated signal of the short pulse signal EPS from the AND circuit 272h (refer to the signal SSX).

As a regenerated signal of the short pulse signal EPS, a pulse signal having a pulse width which is 29/4 times as long as Pw is generated in the example shown in FIG. 35, and a pulse signal having a pulse width which is 21/4 times as long as Pw in the examples shown in FIGS. 36, 37, and 38. As such, there is a difference of (2×Pw) in a pulse width of a regenerated signal of the short pulse signal EPS between the example shown in FIG. 35 and the examples shown in FIGS. 36, 37, and 38. Nonetheless, that difference is smaller than the pulse width EPWS of the short pulse signal EPS, and thus is substantially insignificant in regenerating the informational data IFD in the data decoding part 163.

Figure 39:
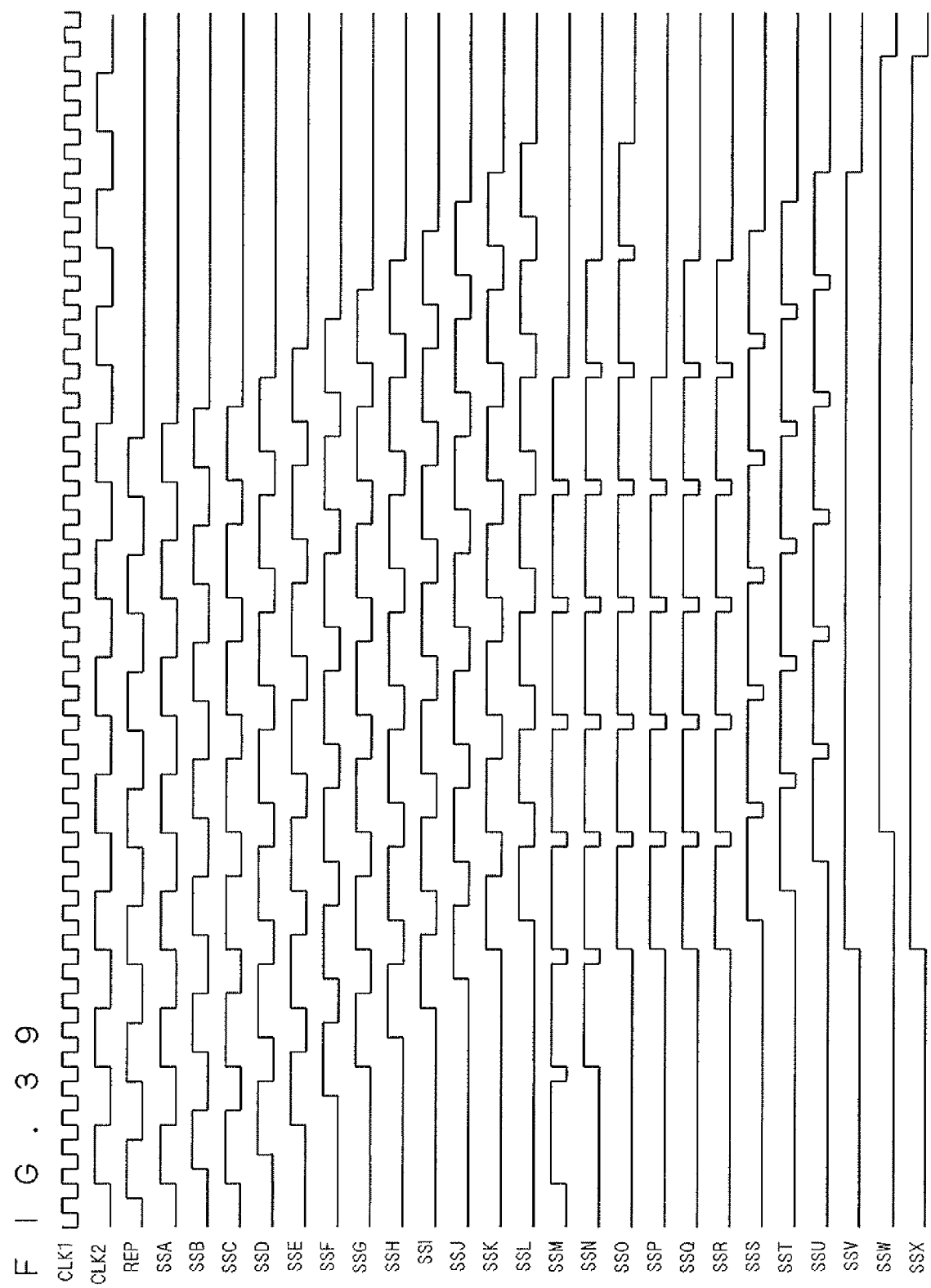
FIG. 39 is a view for showing operations of the modification of the pulse regenerating part according to the second preferred embodiment of the present invention.

In the modification of the pulse regenerating part 162 shown in FIGS. 32, 33, and 34, the long pulse signal EPL also can be regenerated. FIG. 39 is a view for showing operations of the modification of the pulse regenerating part 162 in regenerating the long pulse signal EPL. FIG. 39 shows operations of the modification of the pulse regenerating part 162 in a case where all the seven pulse signals LP arising from the long pulse signal EPL are input to the receiving device 160. As shown in FIG. 39, when the seven pulse signals REP arising from the long pulse signal EPL are input to the serial-parallel converting circuit 270, a pulse signal having a pulse width which is larger than that shown in the examples of FIGS. 35, 36, 37, and 38 is output from the OR circuit 272h of the regenerated pulse supplier 272, as a regenerated signal of the long pulse signal EPL (refer to the signal SSX).

Figure 40:
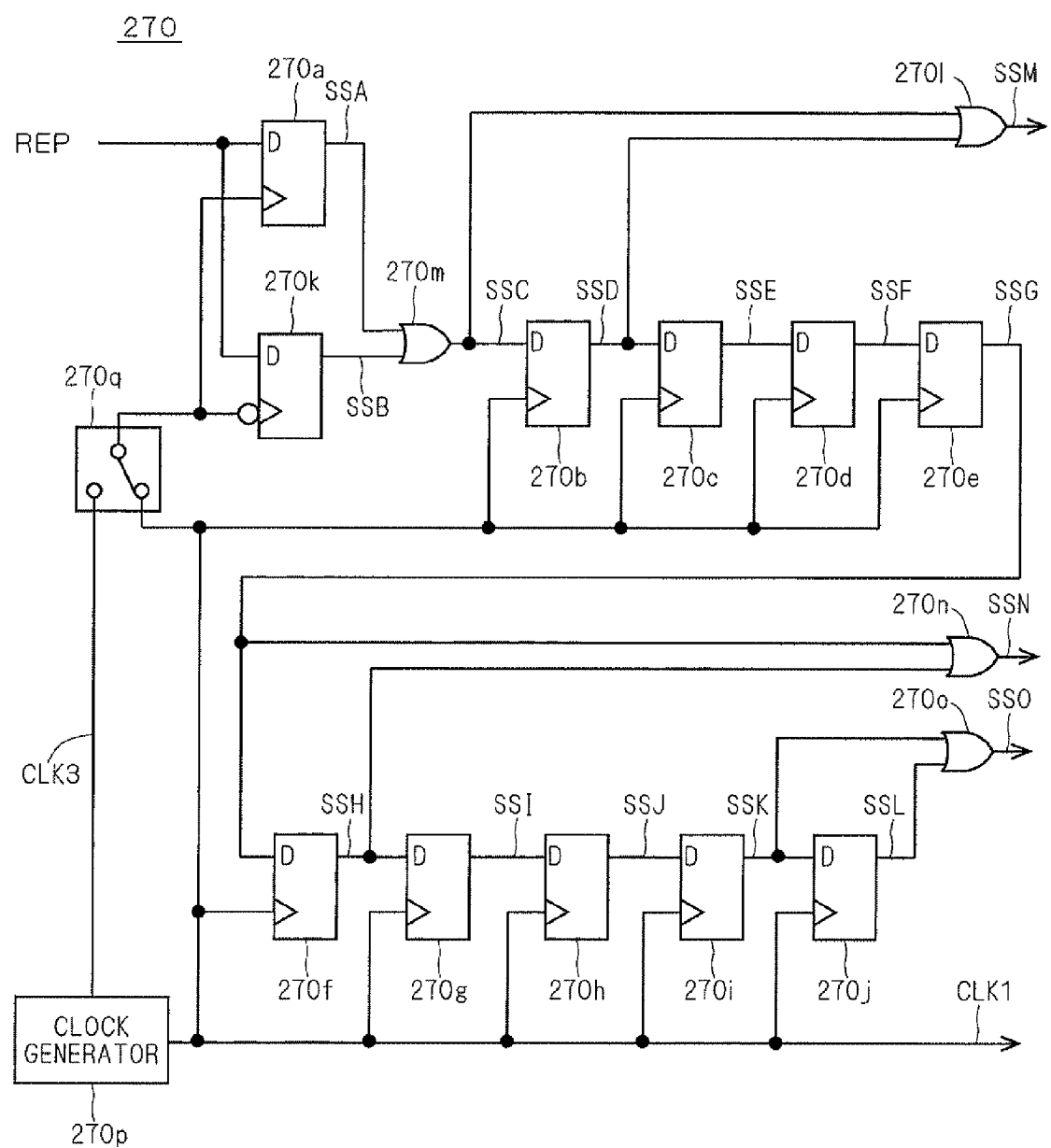
FIG. 40 is a view for showing a structure of another modification of the serial-parallel converter according to the second preferred embodiment of the present invention.

Additionally, though the serial-parallel converting circuit 270 shown in FIG. 32 feeds the clock signal CLK1 having a period which is equal to a half of Pw to the flip-flop circuits 270a and 270k, the serial-parallel converting circuit 270 may alternatively be configured to feed a clock signal CLK3 having a period which is a quarter of Pw, in other words, a clock signal CLK3 at double speed relative to the clock signal CLK1, as shown in FIG. 40. To this end, not only the clock signal CLK1 having a period which is equal to a half of Pw, but also the clock signal CLK3 having a period which is equal to a quarter of Pw is output from the clock generator 270p, as shown in FIG. 40. Then, a switching circuit 270q for selecting and outputting either the clock signal CLK1 or the clock signal CLK3 is additionally provided, and an output signal of the switching circuit 270q is fed to the flip-flop circuits 270a and 270k, as a clock signal. As a result, a clock signal fed to the flip-flop circuits 270a and 270k can be changed from the clock signal CLK1 having a period which is equal to a half of Pw to the clock signal CLK3 having a period which is equal to a quarter of Pw.

Also, the serial-parallel converting circuit 270 may alternatively be formed of circuitry shown in FIG. 41. As shown in FIG. 41, the clock generator 270p outputs not only the clock signal CLK1, but also a clock signal CLK4 having period which is equal to one-eighth of Pw. Flip-flop circuits 270r through 270u are serially connected in the order noted, and each of the flip-flop circuits 270r through 270u holds and outputs an output signal fed from a preceding stage at a rising edge of the clock signal CLK4. The flip-flop circuit 270u at the last stage outputs a signal held thereby as a non-inverted output signal, and also, inverts the held signal to output it as an inverted output signal. The flip-flop circuit 270r holds and outputs the inverted output signal of the flip-flop circuit 270u at a rising edge of the clock signal CLK4.

The pulse signal REP is input to a data input terminal D of each of flip-flop circuits 270a1, 270a2, 270k1, and 270k2. The flip-flop circuit 270a1 holds and outputs a signal input to the data input terminal D thereof at a rising edge of an output signal of the flip-flop circuit 270r. The flip-flop circuit 270a2 holds and outputs a signal input to the data input terminal D thereof at a rising edge of an output signal of the flip-flop circuit 270s. The flip-flop circuit 270k1 holds and outputs a signal input to the data input terminal D thereof at a rising edge of an output signal of the flip-flop circuit 270t. The flip-flop circuit 270k2 holds ant outputs a signal input to the data input terminal D thereof at a rising edge of a non-inverted output signal of the flip-flop circuit 270u. Then, the OR circuit 270m calculates OR of the output signals of the flip-flop circuits 270a1, 270a2, 270k1, and 270k2, and outputs the result as the signal SSC. The other respects in structure are the same as shown in FIG. 32.

As is described above, the serial-parallel converting circuit can be formed with the use of the clock signal CLK4 having a period which is one-eighth of Pw, in other words, the clock signal CLK4 at quadruple speed relative to the clock signal CLK1.

<Application of Present Invention>

Next, an example of a system in which the transmitting device 150 and the receiving device 160 according to the present invention are employed will be described. The following description will deal with a case where the transmitting device 150 and the receiving device 160 are employed in the electronic shelf label system 1 in the above-described store information system 100. The following description will deal with the electronic shelf label system 1 in which the transmitting device 150 and the receiving device 160 are employed according to the second preferred embodiment, while mainly focusing on differences from the electronic shelf label system 1 according to the first preferred embodiment described above.

Figure 42:
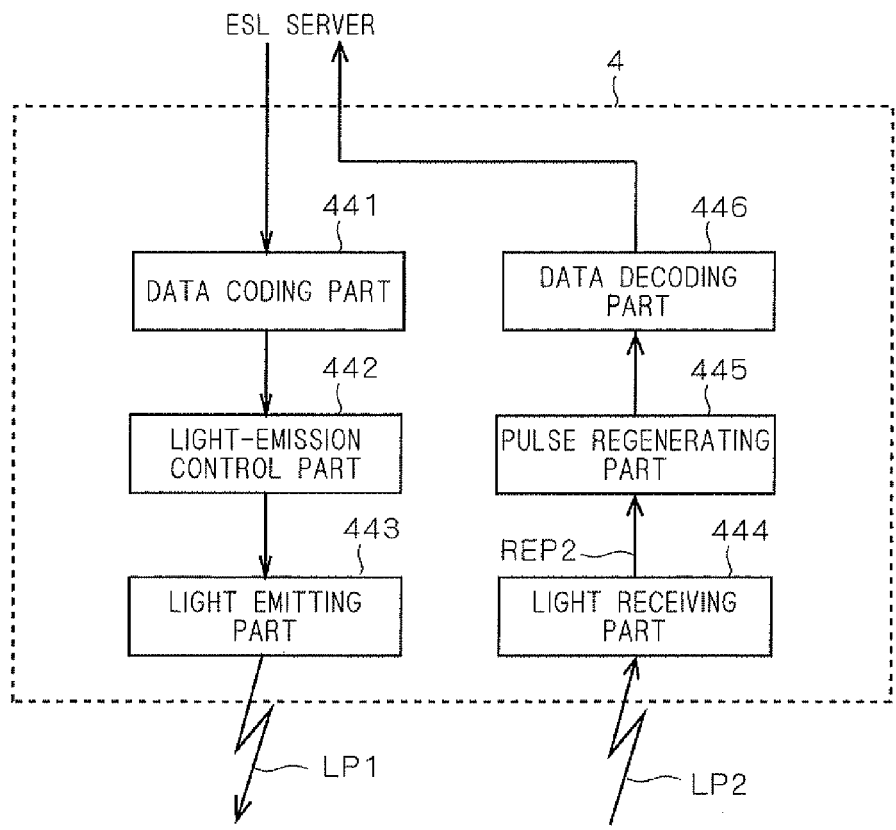
FIG. 42 is a view for showing a structure of a communications device of an electronic shelf label system according to the second preferred embodiment of the present invention.

FIG. 42 is a view for showing a structure of each of the communications devices 4 included in the electronic shelf label system 1 according to the second preferred embodiment. As shown in FIG. 42, each of the communications devices 4 includes a data coding part 441, a light-emission control part 442, a light emitting part 443, a light receiving part 444, a pulse regenerating part 445, and a data decoding part 446. The data coding part 441, the light-emission control part 442, the light emitting part 443, the light receiving part 444, the pulse regenerating part 445, and the data decoding part 446 have the same functions as the data coding part 152, the light-emission control part 154, the light emitting part 153, the light receiving part 161, the pulse regenerating part 162, and the data decoding part 163 which have been described above, respectively. Further, in the electronic shelf label system 1 according to the second preferred embodiment, the ESL server 10 has the same functions as the data generating part 151 and the data analyzing part 164 which have been described above.

The data coding part 441 codes data indicating a "selling price" which is provided from the ESL server 10 according to the coding rule shown in FIG. 2, and outputs the coded data to the light-emission control part 442. The light-emission control part 442, like the above-described light-emission control part 154, controls the light emitting part 443 such that a pulse signal LP1 of infrared light at a predetermined frequency is output from the light emitting part 443, based on the coded data which is received from the data coding part 441. As a result, the short pulse signal EPS contained in the coded data which is generated in the data coding part 441 is converted into three pulse signals LP1 of infrared light, and the long pulse signal EPL contained in the coded data is converted into seven pulse signals LP1 of infrared light. The pulse signals LP1 output from the light emitting part 443 are input to the electronic shelf label 5.

The light receiving part 444 receives a pulse signal LP2 of infrared light which is output from the electronic shelf label 5. The pulse signal LP2 is generated in the same manner as the pulse signal LP1. The light receiving part 444 converts the pulse signal LP2 of infrared light into an electrical signal, and outputs the electrical signal as a pulse signal REP2 to the pulse regenerating part 445. The pulse regenerating part 445 regenerates the short pulse signal EPS and the long pulse signal EPL which are generated in the electronic shelf label 5 from the input pulse signal REP2, and outputs the regenerated signals to the data decoding part 446. As a result, the coded data generated in the electronic shelf label 5 is input to the data decoding part 446. The data decoding part 446 decodes the coded data as input according to the above-described coding rule shown in FIG. 4, to acquire the informational data generated in the electronic shelf label 5. Then, the data decoding part 446 outputs the acquired informational data to the ESL server 10.

Figure 43:
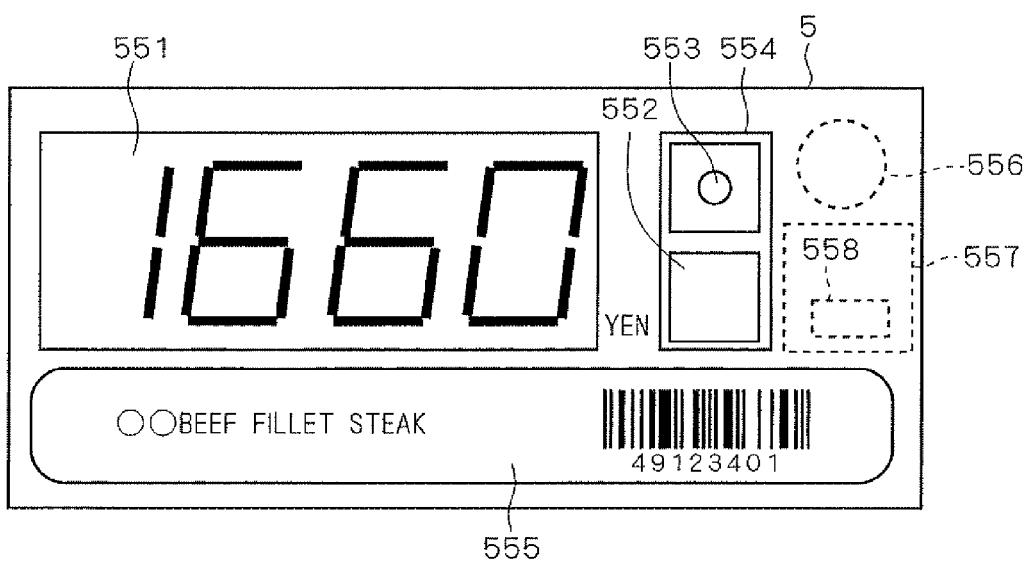
FIG. 43 is a view for showing a structure of an electronic shelf label according to the second preferred embodiment of the present invention.

Next, the electronic shelf label 5 according to the second preferred embodiment will be described. FIG. 43 is a view for showing a structure of the electronic shelf label 5 according to the second preferred embodiment. As shown in FIG. 43, in a front surface of the electronic shelf label 5, a display part 551 for displaying a "selling price" of a product and a communications part 554 responsible for communication with the distribution device 40 are provided. The display part 551 is formed of a liquid crystal display of a dot matrix type, for example.

The communications part 554 includes a light emitting part 552 for outputting the pulse signal LP2 of infrared light and a light receiving part 553 for receiving the pulse signal LP1 from the communications device 4, converting the pulse signal LP1 into an electrical signal, and outputting the electrical signal. The light emitting part 552 has the same functions as the light emitting part 443 of the communications device 4, and the light receiving part 553 has the same functions as the light receiving part 444 of the communications device 4.

Onto a lower portion of the display part 551, an overlay label 555 on which a bar code indicating a "product name" and a "product code" of a product corresponding to the electronic shelf label 5 are printed are put. If a label or the like is not put on the electronic shelf label 5, it is difficult to see which of products corresponds to the electronic shelf label 5. However, because of provision of the overlay label 555, the electronic shelf label 5 and a product visually correspond to each other.

Also, the electronic shelf label 5 includes a compact battery 556 for supplying driving power and a control part 557 formed of an integrated circuit for controlling operations of the electronic shelf label 5. The control part 557 has the same functions as the pulse regenerating part 445 and the data decoding part 446 of the communications device 4. The control part 557 regenerates the short pulse signal EPS and the long pulse signal EPL which are generated in the communications device 4 based on an electrical signal output from the light receiving part 553, to acquire coded data. Then, the control part 557 decodes the coded data according to the above-described coding rule shown in FIG. 4, to acquire informational data. As a result, the electronic shelf label 5 can receive data indicating a "selling price" from the ESL server 10. Further, the control part 557, which has the same functions as the above-described data analyzing part 164, analyzes the received data and operates in accordance with details of the received data. Moreover, the control part 557 also has the same functions as the data generating part 151, the data coding part 441 of the communications device 4, and the light-emission control part 442 of the communications device 4, which have been described above. Specifically, the control part 557, upon receipt of data indicating a "selling price", generates binary data indicating the receipt, and codes the binary data according to the above-described coding rule shown in FIG. 2, to generate coded data. The control part 557, like the above-described light-emission control part 154, controls the light emitting part 552 such that the pulse signal LP2 of infrared light at a predetermined frequency is output from the light emitting part 552, based on the coded data as generated. As a result, the short pulse signal EPS contained in the coded data generated in the control part 557 is converted into three pulse signals LP of infrared light, and the long pulse signal EPL contained in the coded data is converted into seven pulse signals LP2 of infrared light. The pulse signals LP output from the light emitting part 552 are input to the communications device 4.

Furthermore, the control part 557 includes a memory 558 for storing a variety of information. The memory 558 stores data indicating a "selling price" which is obtained from the pulse signals LP1, data indicating a counterpart code of its own device, and the like. The control part 557 reads out data indicating a "selling price" from the memory 558, and controls the display part 551 based on the read data. As a result, a "selling price" is displayed on the display part 551.

Next, a series of operations of the electronic shelf label system 1 according to the second preferred embodiment, which operations are performed in order to display a selling price on the electronic shelf label 5, will be described. In the electronic shelf label system 1 according to the second preferred embodiment, like the first second preferred embodiment, a "selling price" is distributed from the distribution device 49 to the electronic shelf label 5 at the time of start-up, at the time of updating a "selling price" which is to be displayed on the electronic shelf label 5, and at the other like times. It is noted that updating of a "selling price" is needed when a regular price listed in the product master 301 is changed or when a selling price is changed from a regular price to a bargain price for bargain sale. At the time of start-up of the system, "selling prices" of all products in a store are distributed. On the other hand, at the time of updating a "selling price", only "selling prices" of products, which should be updated, are distributed. As a result, "selling prices" displayed on the electronic shelf labels 5 always match "selling prices" which are supposed to be provided at the time of checkout in the cash registers 32. The following description will deal with operations for distributing a "selling price" of one given product. In the following description, a product, of which selling price should be distributed, will be referred to as a "target product", and the terms "device code" which is used in the above description will be replaced by terms "counterpart code".

First, the record 102 regarding the target product in the product file 101 is referred to, and a "selling price" which is either a "regular price" or a "bargain price" that should be distributed, and a "counterpart code" are acquired, in the ESL server 10 of the distribution device 40. The thus acquired "counterpart code" is a "counterpart code" of one of the electronic shelf labels 5 which corresponds to the target product, and the acquired "selling price" is a "selling price" which should be displayed on the one electronic shelf label 5. The acquired "selling price" and "counterpart code" are transmitted as electrical signals to the communications device 4 via the communications cable 22.

The signals indicating the "selling price" and the "counterpart code" are coded in the communications device 4. The communications device 4 controls the light emitting part 443 based on coded data obtained by coding in the communications device 4. As a result, the communications device 4 outputs the pulse signal LP1 containing information about the "selling price" and the "counterpart code".

The pulse signal LP1 output from the communications device 4 is received by the communications part 54 of the electronic shelf label 5 and converted into an electrical signal. The control part 557 acquires data indicating the "selling price" and the "counterpart code" from the electrical signal obtained in the communications part 554.

Subsequently, the control part 557 determines whether or not the acquired "counterpart code" matches a counterpart code of its own device which has been previously stored in the memory 558. If the acquired "counterpart code" does not match the counterpart code of its own device, the received pulse signal LP1 is determined to be a signal for the other electronic shelf label 5, to terminate a process.

On the other hand, if the acquired "counterpart code" matches the counterpart code of its own device, the received pulse signal LP1 is determined to be a signal for its own device, and display of the display part 551 is updated by the control part 557 based on the acquired "selling price".

By the above-described operations, distribution of a "selling price" from the distribution device 40 to the electronic shelf label 5 is achieved.

After display of the display part 551 is updated, the pulse signal LP2 containing information indicating successful receipt of the data indicating the "selling price" is output from the light emitting part 552 of the electronic shelf label 5. The pulse signal LP2 is received by the communications device 4, and the information contained in the pulse signal LP2 is transmitted to the ESL server 10. As a result, the ESL server 10 of the distribution device 40 can confirm whether or not the data indicating the "selling price" is successfully received by the electronic shelf label 5. Thus, when the pulse signal LP2 is not output from the electronic shelf label 5, for example, the ESL server 10 determines that the data indicating the "selling price" is not successfully received by the electronic shelf label 5, and is allowed to perform a process of repeatedly outputting the data indicating the "selling price" or the other like processes until the pulse signal LP2 is received. In this manner, display on the electronic shelf label 5 can be surely updated, resulting in considerable improvement in reliability of the system.

It is additionally noted that though the above description in the second preferred embodiment has dealt with a case where the transmitting device 150 and the receiving device 160 according to the present invention are applied to an electronic shelf label system as an example, those devices are applicable to the other systems, of course.

While the invention has been shown and described in detail, the foregoing description is in all aspects illustrative and not restrictive. It is therefore understood that numerous modifications and variations can be devised without departing from the scope of the invention.

The invention claimed is:

1. A coding device comprising
a first and a second converters for converting informational data of N (N≧2) bits into coded data of M (M≧$2^N$−1) bits according to a predetermined coding rule, wherein
said first converter converts one kind of $2^N$ possible kinds of bit strings of said informational data into alternately a bit string of M bits in which each of respective values of L (2≦L≦M) bits in successive bit positions is one of "0" and "1" and a bit string of M bits in which each of respective values of all bits is the other of "0" and "1"; and
said second converter converts each of the other kinds of said $2^N$ possible kinds of bit strings of said informational data into bit strings of M bits which differ from one another, in each of which a value of only one bit or each of respective values of K (2≦K<L) in successive bit positions is said one of "0" and "1".

2. The coding device according to claim 1, wherein
a relationship of M≧$2^N$ is established, and
said first and said second converters encode said informational data such that a value of a predetermined bit in said coded data is always said other of "0" and "1".

3. The coding device according to claim 1, further comprising
a third converter for converting said informational data into a bit string of M bits in violation of said predetermined coding rule.

* * * * *

UNITED STATES PATENT AND TRADEMARK OFFICE
CERTIFICATE OF CORRECTION

PATENT NO. : 7,750,827 B2
APPLICATION NO. : 12/281496
DATED : July 6, 2010
INVENTOR(S) : Shigemitsu Mizukawa It is certified that error appears in the above-identified patent and that said Letters Patent is hereby corrected as shown below:

Column 2, line 39, delete "$(M \geq 2^N 1)$" and insert -- $(M \geq 2^N -1)$ --;

Column 10, line 52, delete "Coding" and insert -- <Coding --.

Signed and Sealed this

Sixteenth Day of November, 2010

David J. Kappos
*Director of the United States Patent and Trademark Office*